United States Patent [19]
Olson

[11] Patent Number: 5,495,422
[45] Date of Patent: Feb. 27, 1996

[54] METHOD FOR COMBINING A PLURALITY OF INDEPENDENTLY OPERATING CIRCUITS WITHIN A SINGLE PACKAGE

[75] Inventor: Stephen W. Olson, Wilmington, Mass.

[73] Assignee: Wang Laboratories, Inc., Billerica, Mass.

[21] Appl. No.: 134,809

[22] Filed: Oct. 12, 1993

[51] Int. Cl.[6] ........................................ G06F 1/22
[52] U.S. Cl. .................... 364/491; 364/490; 364/489; 365/230.04
[58] Field of Search ..................... 364/491, 490, 364/489, 488, 578; 357/45, 40; 324/158 R; 307/465; 395/325, 425; 365/230.03, 230.04

[56] References Cited

U.S. PATENT DOCUMENTS

| | | | |
|---|---|---|---|
| 4,602,339 | 7/1986 | Aihara et al. | 364/490 |
| 4,864,381 | 9/1989 | Seefeldt et al. | 357/45 |
| 4,922,441 | 5/1990 | Tsukagoshi et al. | 364/491 |
| 5,017,993 | 5/1991 | Shibata | 357/40 |
| 5,036,473 | 7/1991 | Butts et al. | 364/489 |
| 5,068,603 | 11/1991 | Mahoney | 324/158 R |
| 5,280,202 | 1/1994 | Chan et al. | 307/465 |
| 5,317,698 | 5/1994 | Chan | 395/325 |
| 5,321,664 | 6/1994 | Akimoto | 365/230.03 |
| 5,329,630 | 7/1994 | Baldwin | 395/425 |
| 5,369,595 | 11/1994 | Gould et al. | 364/490 |

FOREIGN PATENT DOCUMENTS

| | | |
|---|---|---|
| 374265 | 5/1989 | Germany . |
| 3742655 | 7/1989 | Netherlands . |

OTHER PUBLICATIONS

Patent Abstracts of Japan, vol. 12, No. 189 (E–616) (3036) Jun. 2, 1988.
Proceedings IEEE Workshop on FPGAS For Custom Computing Machines, Apr. 5, 1993, US, pp. 142–151.
Proceedings IEEE Workshop on FPGAS for Custom Computing Machines, 5 Apr. 1993, US pp. 142–151, Babb et al.
Patent Abstracts of Japan, vol. 12, No. 189, 2 Jun. 1988.

*Primary Examiner*—Kevin J. Teska
*Assistant Examiner*—Russell W. Frejd
*Attorney, Agent, or Firm*—Kenneth L. Milik

[57] ABSTRACT

An integrated circuit has a plurality of interface pins and includes a first circuit block that is comprised of a plurality of gate-equivalent circuits; the first circuit block being a first partition of a data processing system. The integrated circuit further includes at least one other circuit block comprised of a plurality of gate-equivalent circuits; the second circuit block being a second partition of the data processing system. The first and second circuit blocks are capable of operating independently of one another, with each performing an associated function. At least one mode select interface pin is provided, in conjunction with gating circuitry that is interposed between the first and second circuit blocks and the interface pins for selectively coupling, in accordance with a logic level applied to the at least one mode select interface pin, only one of the circuit blocks to the interface pins. A method of specifying a gate array integrated circuit to include a plurality of independently operating circuit blocks is also disclosed.

11 Claims, 15 Drawing Sheets

| FIG. 2A | FIG. 2C |
| FIG. 2B | FIG. 2D |

*FIG. 1*

| FIG. 4A | FIG. 4C |
| FIG. 4B | FIG. 4D |

*FIG. 3*

| FIG. 6A | FIG. 6C |
| FIG. 6B | FIG. 6D |

*FIG. 5*

METHOD FOR COMBINING A PLURALITY OF INDEPENDENTLY OPERATING CIRCUITS WITHIN A SINGLE PACKAGE

CROSS-REFERENCE TO A RELATED PATENT APPLICATION:

This patent application is related to commonly assigned patent application Ser. No. 08/134,806, filed Oct. 12, 1993, entitled "APPARATUS AND METHOD FOR INTERFACING A DATA PROCESSOR AND AN IO CONTROLLER TO A MAIN MEMORY", by S. Olson, E. Mann, J. MacDonald, and J. Petersen, now U.S. Pat. No. 5,377,338.

FIELD OF THE INVENTION

This invention relates generally to digital circuitry and, in particular, to methods of designing and constructing digital circuitry.

BACKGROUND OF THE INVENTION

An Application Specific Integrated Circuit (ASIC), also referred to as a gate array, is a well known device for constructing digital circuitry and, most particularly, digital data processing circuitry. An ASIC includes a large number of uncommitted logic functions, such as gates and inverters, and assemblages of logic functions, such as flip-flops, counters, and memory elements. Based on a schematic diagram of a user's circuit, the ASIC circuits are selected and interconnected so as to realize the desired functions. As a result, a circuit that would require a large number of discrete integrated circuit packages to construct can be realized instead within a single integrated circuit package. Advantages to this approach include considerable reductions in packaging volume, power, and propagation delays over a conventional circuit constructed with discrete integrated circuit packages.

One disadvantage to the use of an ASIC is the considerable cost incurred in evolving the initial design through at least one circuit specification and fabrication cycle to arrive at a finished and fully functional integrated circuit. A related problem is a lack of an ability to make substantive circuit changes to the completed ASIC to accommodate circuit corrections and design changes. Typically, each required revision to the original ASIC design results in additional and substantial costs being incurred. Also, for many applications the full capability of the ASIC is not required, resulting in some number of circuits being unused. For example, a given design may require an ASIC having a minimum of 300 interface pins. However, the actual number of gates or cells that are required to implement the design may be only a small fraction of the total number that are available for the ASIC that is selected to meet the interface pin requirements.

As can be appreciated, the foregoing disadvantages are compounded when a design requires the use of two or more ASICs. Additionally, the requirement to schedule the timely production of, and stock, a number of different ASICs can increase overall system costs. Furthermore, although a relatively large total number of ASICs may be provided to a customer by a given vendor, the number for each of the different ASICs may be less than a minimum threshold number required to obtain a significant volume discount.

OBJECTS OF THE INVENTION

It is thus one object of this invention to provide a method for specifying a gate array integrated circuit that overcomes the problems of the prior art.

It is another object of this invention to provide an integrated circuit that includes a plurality of circuit blocks, each being independent of the other, and a gating mechanism that is responsive to externally excited mode select inputs to selectively couple one of the circuit blocks to interface pins of the integrated circuit.

SUMMARY OF THE INVENTION

The foregoing and other problems are overcome and the objects of the invention are realized by a method of fabricating an integrated circuit. The method includes the steps of: (a) providing at least two circuit designs; (b) determining a total number of gates that are required to implement the at least two circuit designs within a gate array; (c) determining a greatest total number of interface pins that are required by one of the designs; (d) selecting a gate array type that has a total number of gates that exceeds the determined number of gates and that has a total number of interface pins that exceeds the determined greatest total number of interface pins; (e) translating each of the designs into a gate array equivalent to provide a specification of a gate array circuit block for each of the designs; (f) defining at least one interface pin to be a mode select input pin; and (g) determining a gate equivalent of a gating logic block for selectively coupling only one of the circuit blocks to the interface pins of the gate array in accordance with an input signal to be applied to the at least one mode select pin.

Further in accordance with this invention an integrated circuit having a plurality of interface pins includes a first circuit block that is comprised of a plurality of gate-equivalent circuits; the first circuit block being a first partition of a data processing system. The integrated circuit further includes at least one other circuit block comprised of a plurality of gate-equivalent circuits; the at least one other circuit block being a second partition of the data processing system. The circuit blocks are capable of operating independently of one another, with each performing an associated function. At least one mode select interface pin is provided, in conjunction with gating circuitry that is interposed between the circuit blocks and the interface pins for selectively coupling, in accordance with a logic level applied to the at least one mode select interface pin, only one of the circuit blocks to the interface pins.

In accordance with a further aspect of this invention there are at least two mode select interface pins. For this case a logic level of a first one of the mode select interface pins specifies a circuit block for coupling to the interface pins, and a logic level of a second one of the mode select interface pins specifies a mode of operation of a specified circuit block.

BRIEF DESCRIPTION OF THE DRAWINGS

The above set forth and other features of the invention are made more apparent in the ensuing Detailed Description of the Invention when read in conjunction with the attached Drawings, wherein:

FIG. 1 illustrates the arrangement of FIGS. 2A–2D;

FIG. 3 illustrates the arrangement of FIGS. 4A–4D;

FIG. 5 illustrates the arrangement of FIGS. 6A–6D;

DETAILED DESCRIPTION OF THE INVENTION

Figure 7:
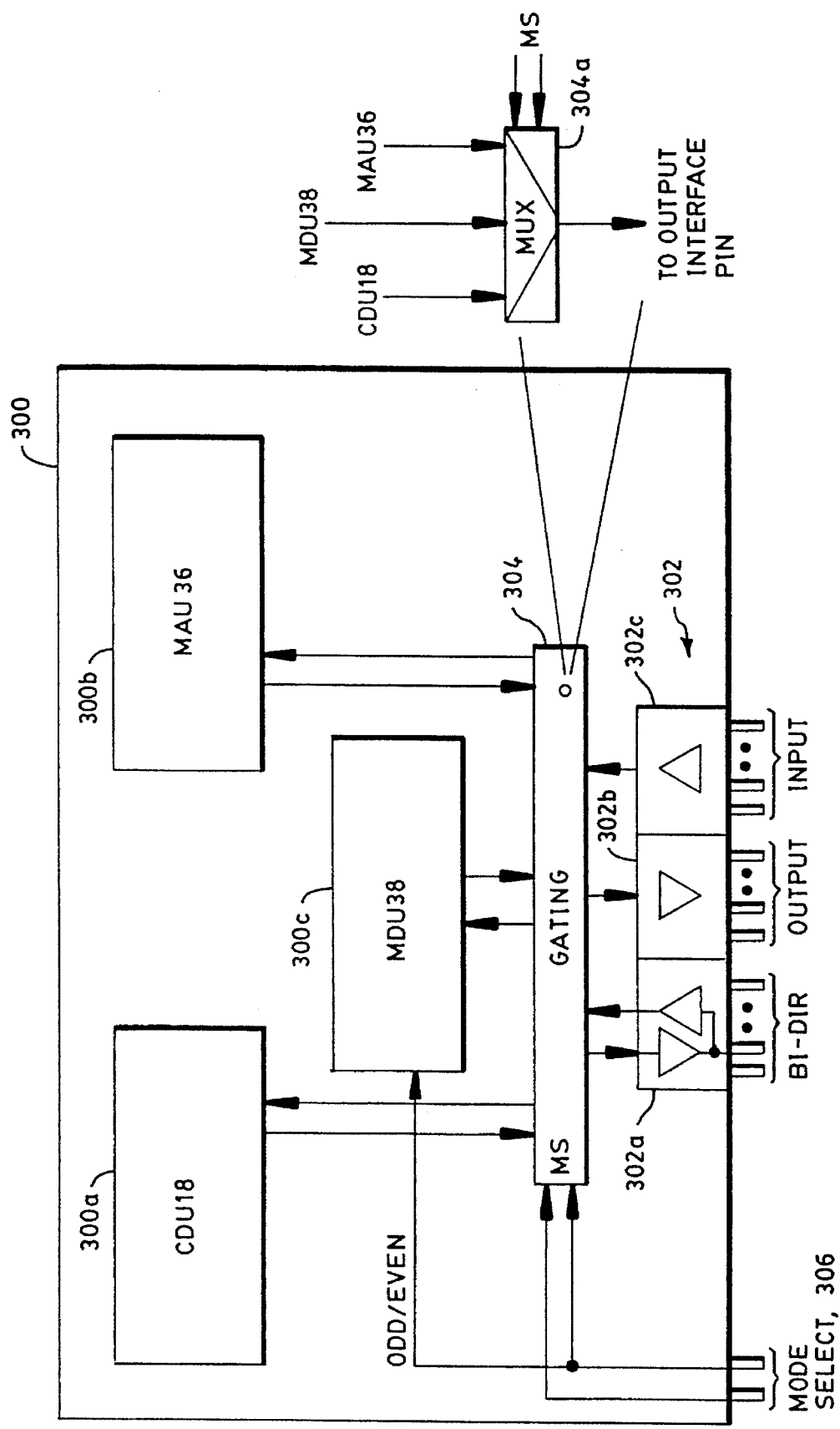
FIG. 7 is a block diagram of a gate array that is constructed in accordance with this invention.

The teaching of this invention is now described in the context of a presently preferred embodiment thereof. Specifically, the teaching of this invention is described in the context of a data processor 10 that is illustrated in FIGS. 2A–2D. As will become apparent below, the data processor 10 includes several complex circuit blocks (CDU, MAU, MDUs) that are shown and described separately. However, and in accordance with this invention, these circuit blocks are all fabricated within a single gate array 300 (FIG. 7). The gate array 300 is provided with a plurality of input mode pins that define the functionality that the gate array will assume when installed in the circuit board upon which the data processor 10 is constructed. At a given circuit board position predetermined logic levels are applied to the input mode pins to selectively set internal gating so as to interconnect a desired circuit block to the interface pins of the gate array. The other, non-selected circuit blocks are not used.

Before describing the teaching of the invention in further detail, reference is made to FIGS. 2A–2D for showing a presently preferred embodiment of a data processing system that makes use of this invention.

A Central Processor (CP) 12 is coupled to an 8K by 88-bit Control Store 14 by a 14-bit control store address bus 14a and an 88-bit control store data bus 14b. The Control Store 14 stores microinstructions which are read into the CP 12 in order to execute macroinstructions that are read from an 8K by 72-bit CACHE memory 16, via a CACHE Data Unit (CDU) 18, bidirectional 64-bit buffered data store bus BDSB00:63 18a, and bidirectional 32-bit data bus DB00:32 12a.

Macroinstructions are fetched from the CACHE memory 16 in accordance with physical addresses provided by the CP 12 on a 32-bit physical address bus (PA0:31) 12b, via a CACHE address multiplexer (MUX) 20. The CACHE address MUX 20 is employed when pre-filling the CACHE 16 with instructions and data. In this embodiment of the invention only PA bits 16:28 are provided to the CACHE 20. PA bit 28 being provided as the LSB address bit enables a Double-Word (eight bytes or two 32-bit words) to be read by the CP 12 over the 64-bit BDSB 18a and 32-bit bus 12a. The eight bit DSP0:7 bus 18b conveys data parity bits between the CACHE 16 and the CDU 18. The CDU 18 operates as a data buffer for interfacing the 32-bit CP 12 data bus 12a to the 64-bit cache/main memory BDSB 18a, as a data error checker, and provides data alignment for the CP 12.

In the illustrated embodiment the macroinstructions that are read from the CACHE 16 are those that implement a VS assembly language program that is provided by Wang Laboratories Inc. of Lowell Mass.

The 32-bit processor data bus 12a is buffered by a transceiver 22 and is provided as a buffered data bus (BDB0:31) 22a to several locations, including a 16K by 8-bit Data Key memory 24, a 16-bit control and status register (XCTLREG) 26, a reference and change table (REF/CNG TABLE) 28, and a system (backplane) Bus Interface Chip (BIC) 30. This data path gives the CP 12 an ability to send control information to, and read status information from, these various devices.

The Data Key memory 24 stores encrypted information and provides a capability to enable only specified software packages to be executed by the CP 12. The REF/CNG Table 28 functions to indicate a reference to a particular page of memory, and to indicate if the reference was a write operation. The BIC 30 provides an interface to other components that are coupled to the system bus 32, the system bus including a 32-bit multiplexed address/data bus (AD31:0) 32a, associated parity lines (PAR3:0) 32b, and control signal lines 32c. In general, the BIC 30 operates to arbitrate access to the system bus 32 and to perform all necessary handshaking with other devices that are coupled to the system bus 32. The XCTLREG 26 enables control over the CACHE memory 16, indicates CACHE status, and also provides indications of correctable and uncorrectable data errors.

A buffer 34 drives the PA bus 12b as a CP Address (CPA) bus 34a to the Data Key 24 (14 bits), the REF/CNG Table 28 (16 bits) and a Memory Address Unit (MAU) 36 (27 bits). The MAU 36 is shown in greater detail in FIGS. 4A–4D. The MAU 36 operates to queue memory read and write addresses and functions, in conjunction with even and odd Memory Data Units (MDUs) 38a and 38b, respectively, (FIGS. 6A–6D), to write and read data from main memory 40. Main memory 40 is comprised of a plurality of DRAM modules 40a–40d, and is organized as an even word array (modules 40a and 40b) and as an odd word array (modules 40c and 40d). The total width of the main memory 40 is 64 bits (a double word), plus 14 bits of parity information. Parity is determined separately on each odd and even 32-bit memory word.

The MAU 36 also receives a 27-bit I/O address (IOA) bus 36a that is sourced from the BIC 30 via a Buffered Address (BA) bus 30a and a latch 42. IOA bus 36a provides a first memory address of a data block that is to be written to or read from by an I/O device that is coupled to the system bus 32. The first address is received though a transceiver 44, a buffered address/data (BAD) bus 44a, and a transceiver 45. Transceiver 45 is enabled to pass the first memory address of the memory block to the BIC 30 and the latch 42, via the BA bus 30a. In the MAU 36 the first address is buffered, and subsequent memory addresses are incremented by the BIC 30 during an I/O operation and provided over the buses 30a and 36a, via latch 42. This enables a potentially large number of reads or writes to be made to consecutive memory locations of the main memory 40. The operation of the MAU 36 will be described below in greater detail.

One output of the MAU 36 is a 22-bit memory address (MA) bus 36b that is applied to a row/column MUX 46 which has a 12-bit output for sequentially providing row and column addresses, via drivers 48a-48d, to the DRAM modules 40a-40d, respectively. The row/column MUX 46 operates under the control of a COL signal that is generated by a memory control state machine that forms a part of a memory controller 31.

Another output of the MAU 36 is a 24-bit update address (UPDT) bus 36c that is latched by a register XMAR 50. XMAR 50 sources a registered update address (RUPDT) bus 50a to the MUX 20 (13 bits), to a MUX 52 (24 bits), to a driver 54, and to an External Tag Store 56. Also provided to MUX 52 is the PA bus 12b. The output of the MUX 52 is a 13-bit internal tag store address (ITSA) bus 52a and an 11-bit internal tag store data (ITSD) bus 52b which are applied to an Internal Tag Store 58. The output of the driver 54 is a 13-bit external tag store address (XTSA) bus 54a which is applied to the External Tag Store 56, in conjunction with 11-bits of the RUPDT bus 50a. The External Tag Store 56 and the Internal Tag Store 58 provide CACHE hit and miss detection, XMIS and IMIS, respectively, for I/O accesses and CP 12 accesses respectively.

The MDUs 38a and 38b operate in conjunction with registered buffers 60a and 60b, respectively, to provide a data queue for read and write accesses of the main memory 40. The MDUs 38a and 38b also each provide for word-wide ECC generation and checking functions for data going to and coming from the main memory 40. Each of the MDUs 38a and 38b is bidirectionally coupled to one word (32-bits) of the 64-bit buffered data store bus 18a, and thereby to the CACHE 16 and to the CDU 18. Each of the MDUs 38a and 38b also source 4-bits of the 8-bit CP Data Parity (CPDP) bus which is provided through a buffer 64 to the eight bit DSP0:7 bus 18b that conveys data parity bits between the CACHE 16 and the CDU 18. The MDUs 38a and 38b each also have a 32-bit I/O data path (IOD) and are bidirectionally coupled in parallel to a transceiver 62 and thence to the BAD bus 44a. For I/O data transfers to or from the system bus 32 the MDUs are alternately selected to either transmit up to a 32-bit word to the transceiver 62, or receive up to a 32-bit word from the transceiver 62. The MDUs 38a and 38b are described below in greater detail.

The above-mentioned memory controller 31 (FIG. 2D) includes a memory request arbitration state machine that is responsive to CP memory requests, IO memory requests, and Refresh memory requests. The memory controller 31 also includes a DRAM control state machine. The memory controller 31 operates to control access to, and the sequencing of, the main memory 40. The timing signals that are generated by the memory controller 31 provide for quad-word read, CP write, word/double-word write, and partial or read-modify-write (RMW) operations, respectively.

The data processor 10 of FIGS. 2A–2D, in a presently preferred embodiment of the invention, is packaged on a single multi-layered printed circuit board. In accordance with this invention, the CDU 18, MAU 36, and the MDUs 38a and 38b are each contained within a single ASIC or gate array package that is used at a plurality of different circuit board positions.

Figure 2A:
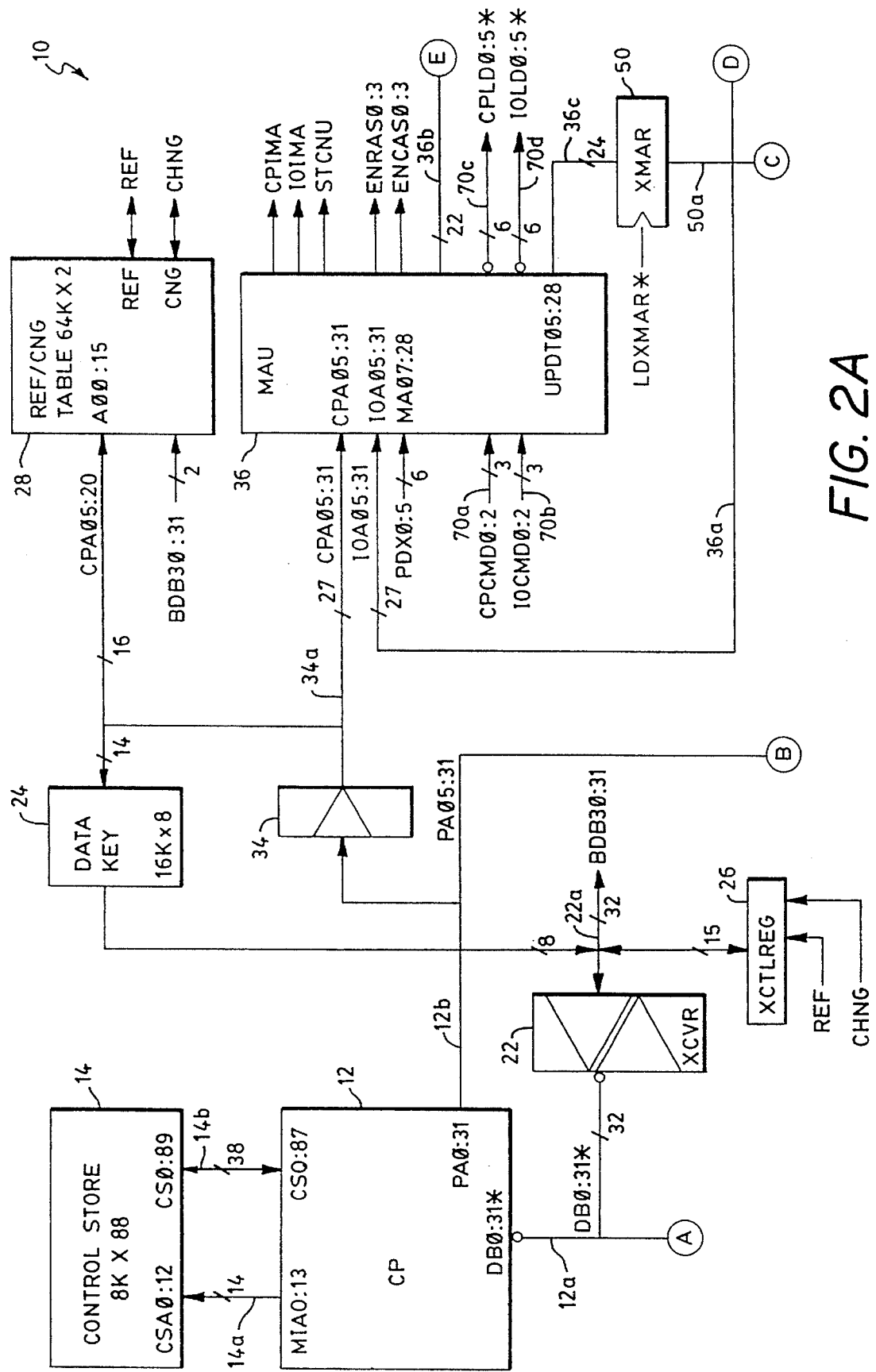
FIGS. 2A–2D are each a portion of a block diagram of a data processor that is constructed and operated in accordance with this invention so as to include a common gate array package that is used in a plurality of different locations for different circuit functions.
Figure 2B:
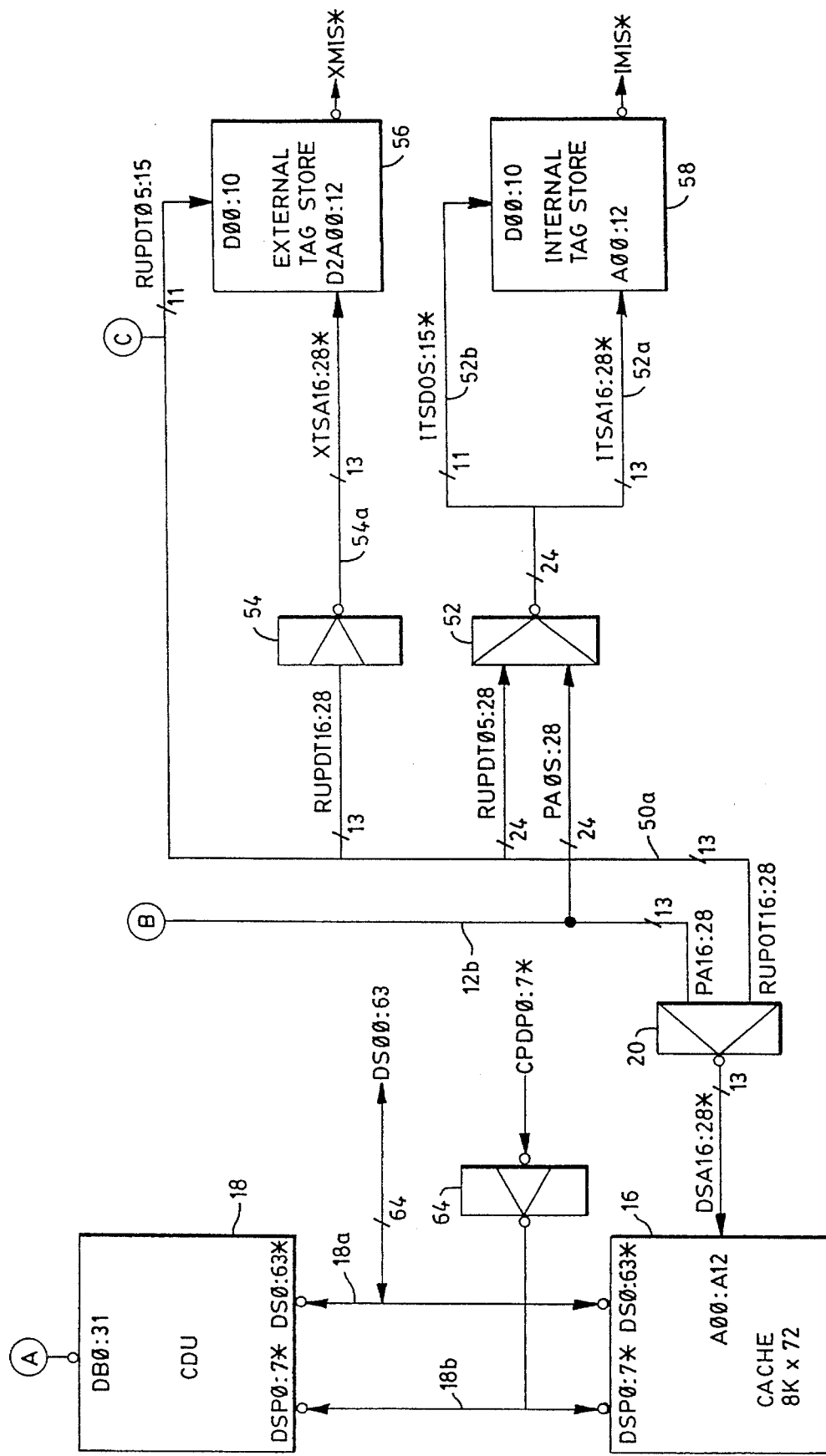
Figure 2C:
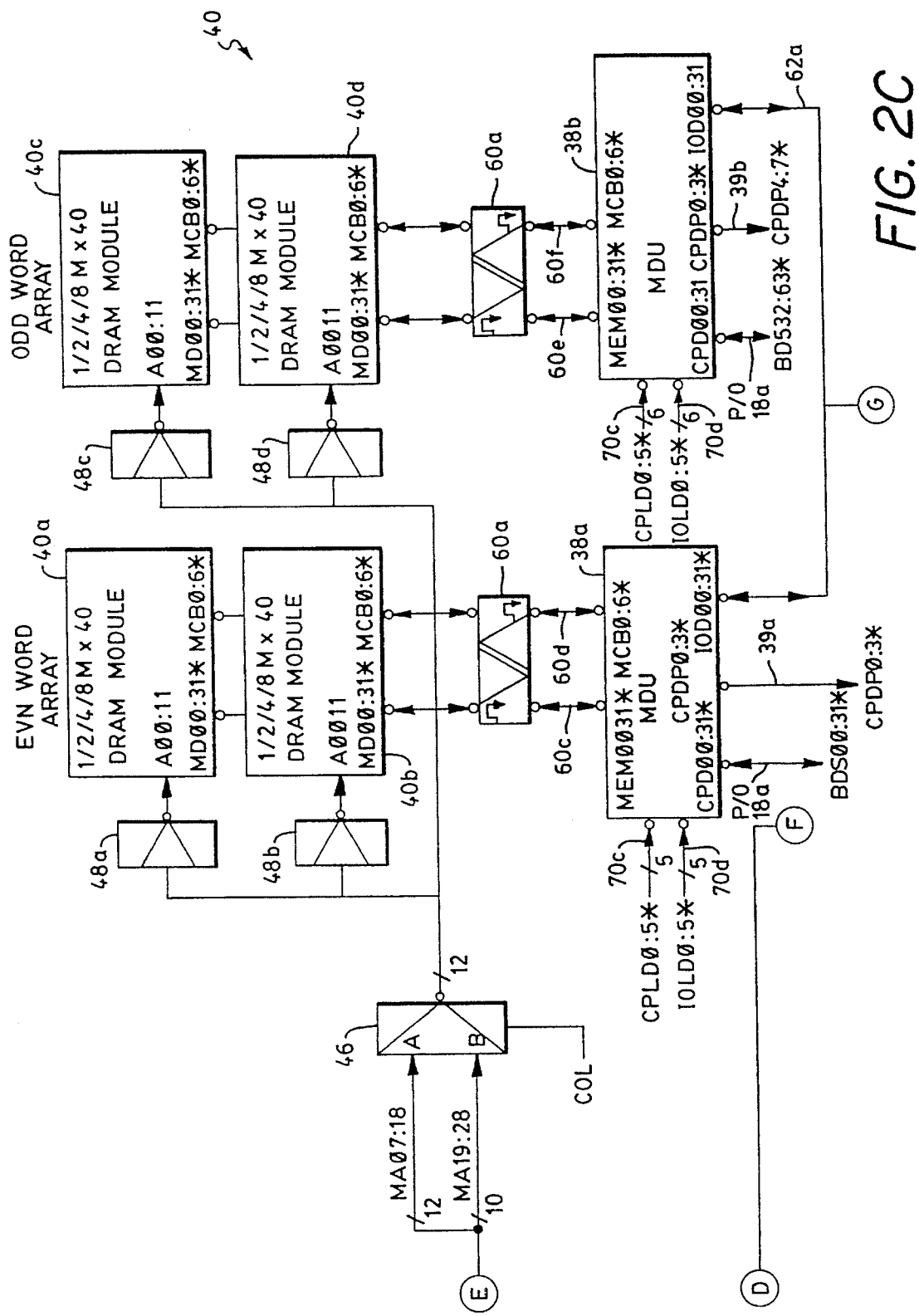

Reference is now made to FIGS. 4A–4D which illustrate the construction of the MAU 36 that is shown in FIG. 2A. A CP/IO Write Register Control 70 receives as inputs a 3-bit CP command (CPCMD) 70a, a 3-bit IO command (IOCMD) 70b, the three LSBs of the CP address (CPADR) bus 34a, and the three LSBs of the IO address (IOADR) bus 36a. Based on this information the Write Register Control 70 provides a first 5-bit code (CPLD) 70c that specifies to the MDUs 38a and 38b a CP 12 data modifier field, and a second 5-bit code (IOLD) 70d that specifies to the MDUs 38a and 38b an IO data modifier field. As such, CPLD and IOLD are employed during write operations, as described below, to cause the loading into the MDU 38 of a designated byte or bytes, and to set Mark bits accordingly.

The MAU 36 also includes an Address Register clock enable block 72 that receives two CP 12 clock signals (CKCP) 72d and which outputs clocks 72a, 72b, and 72c to a first CP Address Register (CP ADDR REG0) 74, a second CP Address Register (CP ADDR REG1) 76, and a CP Previous Address Register 78, respectively.

Figure 2D:
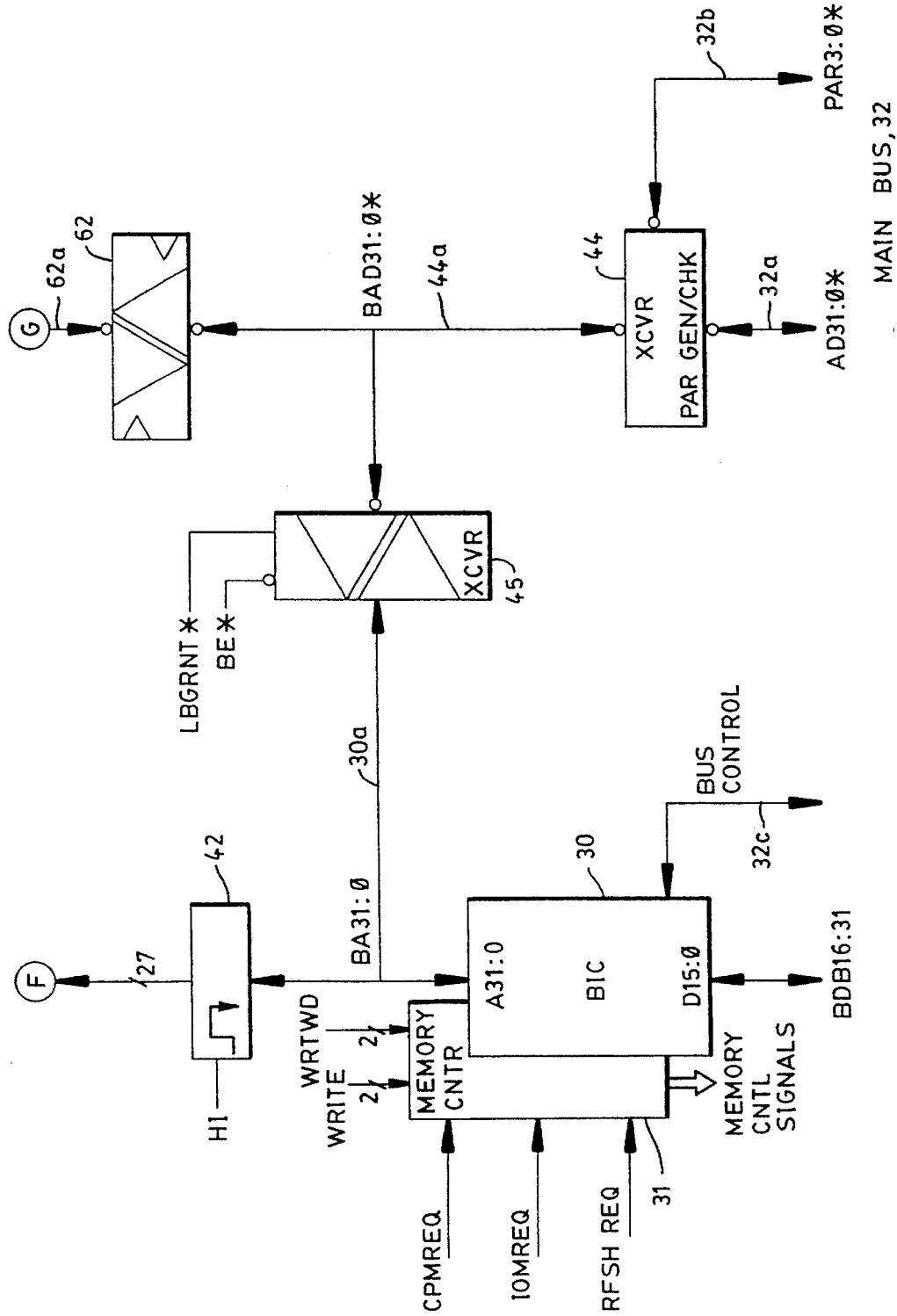
Figure 4A:
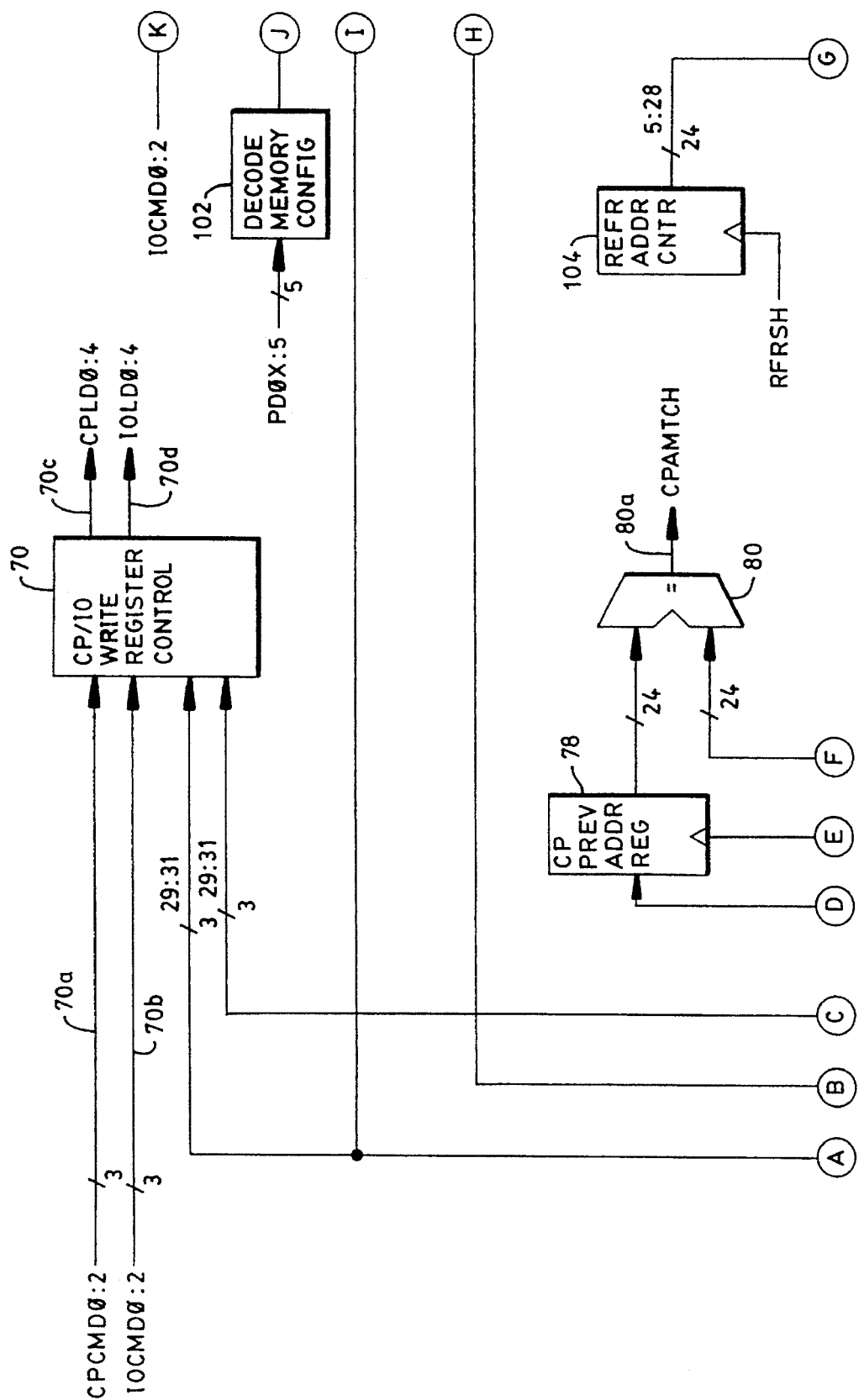
FIGS. 4A–4D are each a portion of a block diagram of a Memory Address Unit (MAU) that is a component of the block diagram of FIGS. 2A–2D, the MAU being one circuit block that is included within the single integrated circuit of this invention.
Figure 4B:
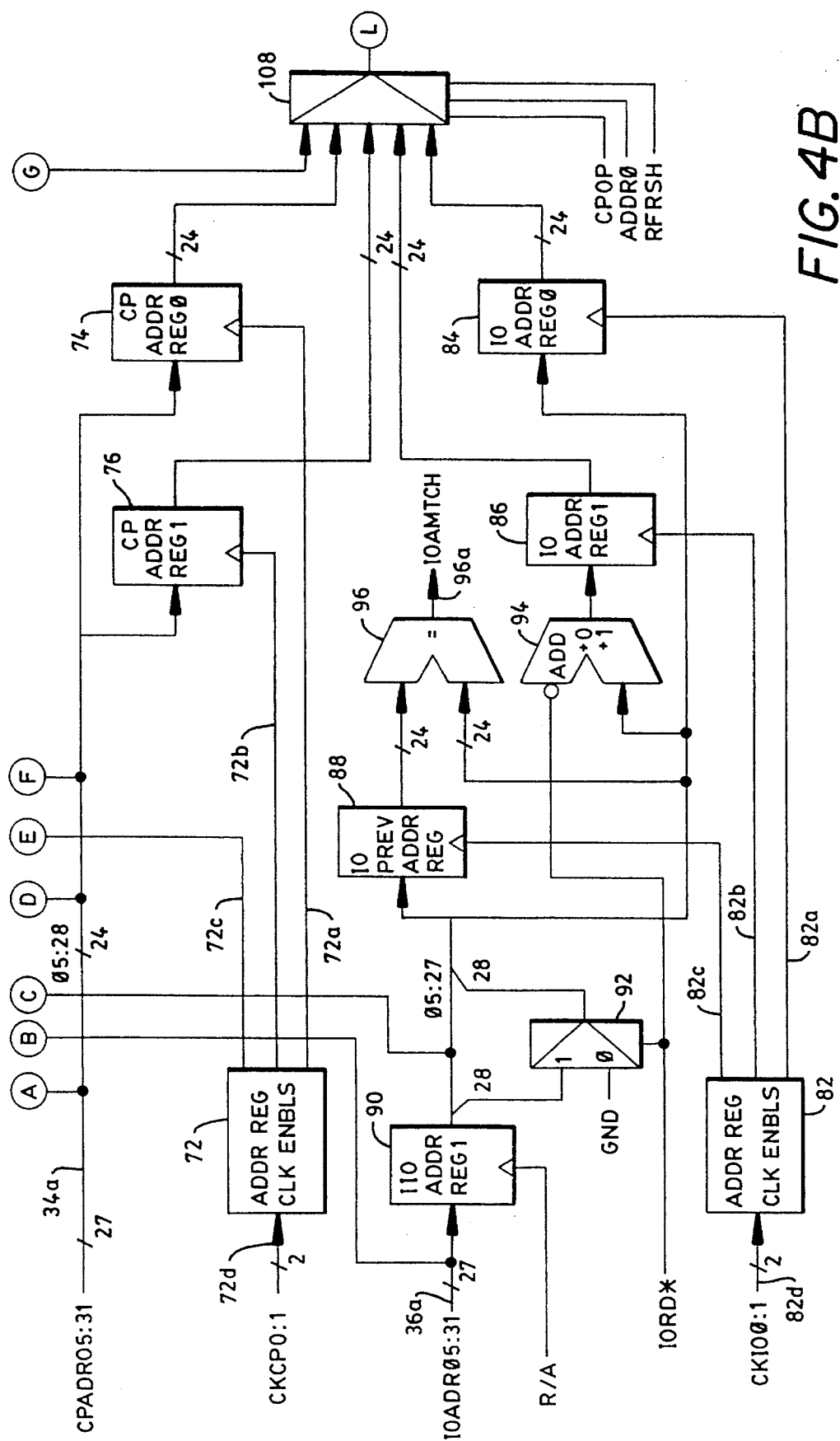
Figure 4C:
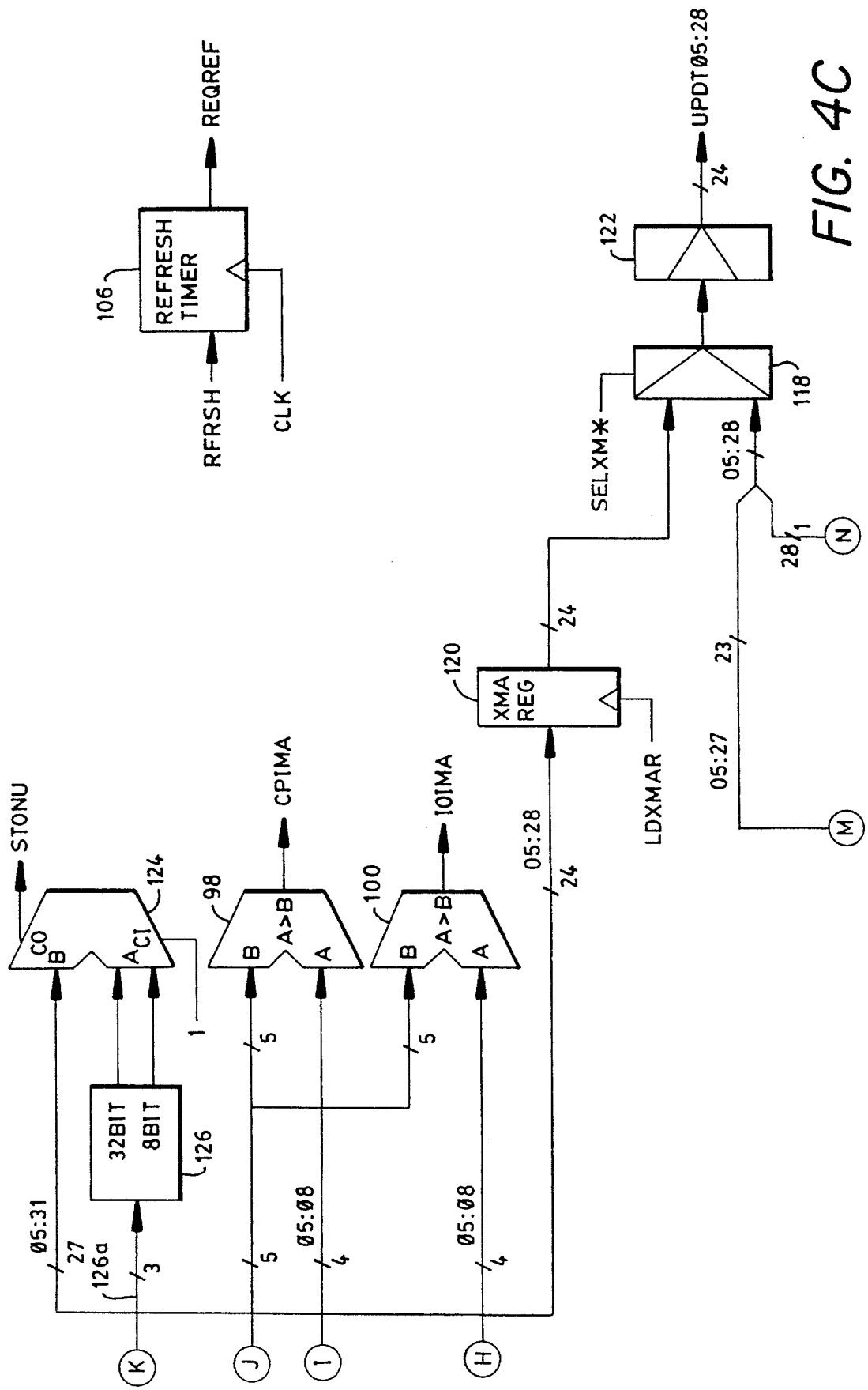
Figure 4D:
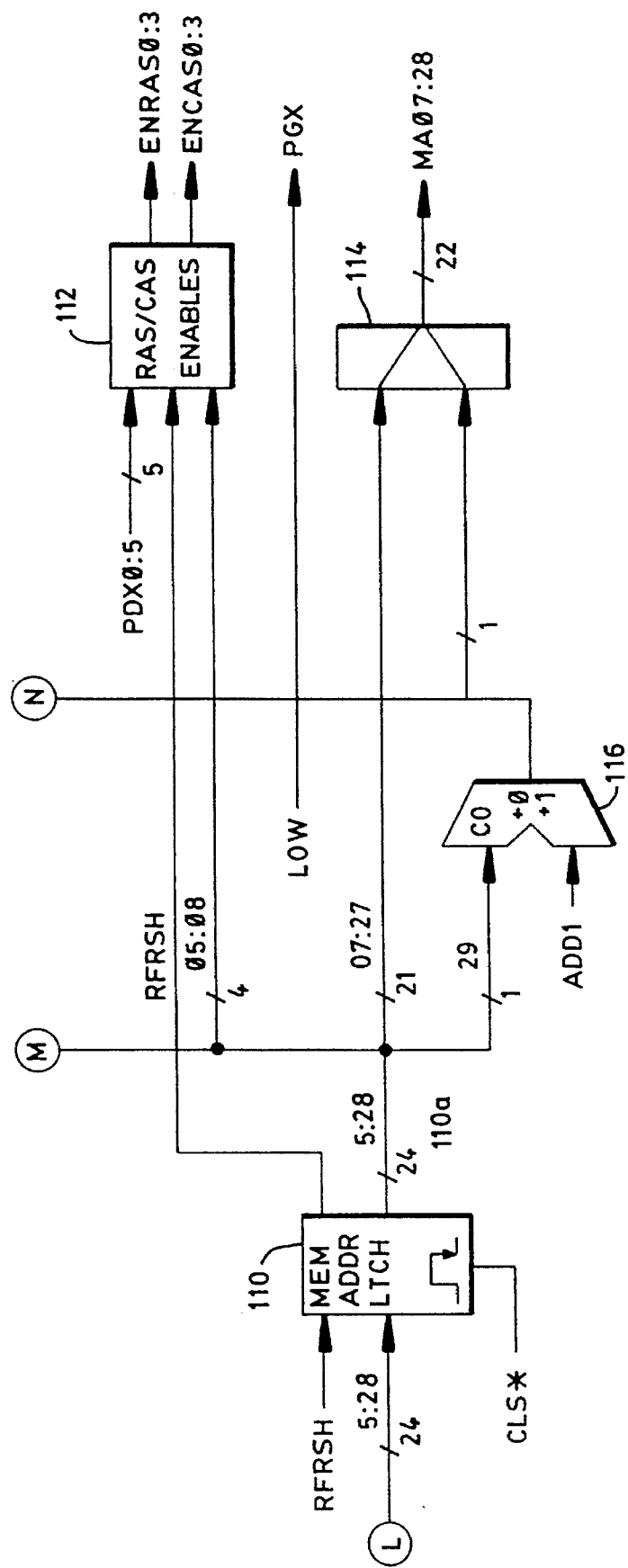

For a first CP 12 memory write operation 24-bits (05:28) of the associated memory address are latched from the CPADR bus 34a into the CP ADDR REG0 74, and also into the CP Previous Address Register 78, and a CP Memory Request (CPMREQ) is asserted to the memory controller 31 of FIG. 2D. The MAU 36 stays in this condition if another CP write does not occur (CPWR*), and so long as the requested CP memory write operation does not complete (CMPL*). If the memory operation is not completed (CMPL*) before a next CP 12 memory access (CPWR), then 24-bits of the next memory address are latched into the CP ADDR REG1 76 (CKCP1), and also into the CP Previous Address Register 78. It is noted that the CP Previous Address Register 78 is clocked whenever CP ADDR REG0 74 or CP ADDR REG1 76 is clocked to store the CP write address that is being received.

Subsequently another CP memory request is issued to the memory controller 31 (CPMREQ), and the MAU 36 remains in the same state until the memory request for the first CP write operation completes (CMPL). While in this state CP ADDR REG1 76 is clocked (CKCP1) on the occurrence of another CP write, and if a comparator 80 indicates a match (CPAMTCH 80a) between the CP write address being received and the CP write address that is stored in the CP PREV ADDR REG 78, and if the previously requested memory operation has not completed. That is, CKCP1=CPWR and CPAMTCH and CMPL*. The assertion of CPAMTCH 80a indicates that the current CP write operation is directed to the same double word of memory as the previous CP write operation whose address is stored in CP ADDR REG1 76. The CPAMTCH signal 80a is used to initiate a selective combination of the current write data with registered write data from one or more previous and yet unexecuted CP write operations. The specifics of the MDU 38 write merge operation are described below.

In this state, and if a CP write is received that does not generate a match with the content of the CP PREV ADD REG 78 (CPAMTCH*), then a write stop (WRSTCP) signal is asserted to halt the CP write operation. This is accomplished in response to the occurence of two buffered CP write operations, and the generation of a third that is not directed to the same double word as the last CP write operation whose address is buffered in CP ADDR REG 1 76.

When the first requested CP write operation (associated with the address stored in CP ADDR REG0 74) completes (CMPL) the CP write stop signal is removed. The state machine stays in this state so long as there is not another CP write (CPWR*), and there is no completion of the second CP memory request that was issued for the address stored within CP ADDR REG1 76. If another CP write operation does occur (CPWR), and if the memory write operation also completes (CMPL), then the CP ADDR REG0 74 is clocked (CKCP0) to store the current write address. The assertion of CKCP0 also causes the CP write address to be stored within the CP PREV ADDR REG 78. If, however, another CP write operation occurs (CPWR) before the memory write operation completes (CMPL*), then the CP ADDR REG0 74 is clocked (CKCP0) to store the associated write address. As before, the assertion of CKCP0 also causes the CP write address to be stored within the CP PREV ADDR REG 78.

Subsequently, a CP memory request (CPMREQ) is issued to the memory controller 31, and the MAU 36 remains in the same state until the memory request for the second CP write operation completes (CMPL). While in this state the CP ADDR REG0 74 is clocked (CKCP0) on the occurence of another CP write, and if the comparator 80 indicates a match (CPAMTCH) between the CP write address being received and the CP write address that is stored in the CP PREV ADDR REG 78, and if the previously requested memory operation has not completed. That is, CKCP0=CPWR and CPAMTCH and CMPL*. As before, the assertion of CPAMTCH 80a indicates that the received CP write operation is directed to the same double word of memory as the previous CP write operation whose address is stored in CP ADDR REG0 74.

If a CP write address is received that does not generate a match with the content of the CP PREV ADD REG 78 (CPAMTCH*), then the write stop (WRSTCP) signal is asserted to halt the CP write operation. The MAU 36 remains in this state until the CMPL signal is received (indicating the write operation associated with the memory address stored in CP ADDR REG1 76 has completed).

The operation of the MAU 36 for a CP memory read operation is as follows. A CP read occurs with a CACHE miss (RMISS) and either a buffered write pending (BWPNDG) or not pending (BWPNDG*). For the former case the MAU 36 delays until there is no buffered write pending. For the latter case the read address is clocked into both CP ADDR REG0 74 and CP ADDR REG1 76, and a CP memory request is asserted (CPMREQ). It is noted that the CP read address need not be clocked into both address buffer registers. The MAU 36 remains in this condition until the CP memory request is completed (CLRDMREQ). At this time the requested data has been returned by the MDUs 38a and 38b.

In summary, the CP 12 write buffer includes a pair of 64-bit memory input data registers and associated mark bit registers (located in the MDUs 38a and 38b), the two 24-bit memory address registers (74,76), and the 24-bit previous address register (78). These registers, in conjunction with associated control logic, are used to buffer CP 12 write addresses and data to main memory 40. A purpose of the CP write buffer is to minimize the number of memory writes and CP stalls due to a memory busy condition. All CP 12 writes are loaded into one data/address register pair on the trailing edge of a CP write cycle and, if no other CP write requests are pending, one is requested. If a Write request is pending, the other data/address register pair is used. If both register pairs have a pending write, the last loaded register is checked for a match on the current write address using the previous address register, and a match of these registers results in the combination of the most recent pending write and the current write into one pending write, using the write merge circuitry of the MDUs 38a and 38b. The previous address register 78 is loaded when either of the other register pairs are loaded.

By detecting write matches, many CP 12 write operations can be eliminated during, for example, loop-type operations where several writes occur within a small range of main memory 40 addresses. The result is a significant reduction in CP 12 generated memory activity, and a corresponding reduction in CP 12 write stalls.

The MAU 36 also includes an Address Register clock enable block 82 that receives two IO clock signals (CKIO) 82d and which outputs clocks 82a, 82b, and 82c to a first IO Address Register (IO ADDR REG0) 84, a second IO Address Register (IO ADDR REG1) 86, and an IO Previous Address Register 88, respectively. The IO address circuitry further includes an input IO Address Register 1 (IIO ADDR REG1) 90 that latches the input IO address as commanded by a R/A signal that is generated by the BIC 30. If an IO read operation is in progress (IORD low) then bit 28 of the IO address is forced to a zero by multiplexer 92, thereby forcing the IO read memory address to be quad-word aligned.

When an IO read operation is initiated an IO Register Zero flag is initialized to zero (IOR0=0), the IO ADDR REG0 84 and the IO REG1 86 are both clocked (CKIO0, CKIO1), as is the IO PREV ADDR REG 88, and an IO memory request (IOMREQ) is issued for the address contained within the IO ADDR REG0 84. The state of IOR0 determines the source of the address applied to the memory (IOR0=0 then IO ADDR REG0 84, IOR0=1 then IO ADDR REG1 86). It is noted that the IO ADDR REG1 86 is loaded with the next quad-word aligned IO read address that is incremented by the adder 94, whereas IO ADDR REG0 84 loads the quad-word aligned IO read address. The MAU 36 then waits for the first IO read to end (IORDEND). The conditions IORDEND and IOR0 being true cause a transition to a next MAU 36 state, with the IOR0 flag being reinitialized to zero (IOR0=0) and a clock IO return (CKIORTN) signal being asserted. The assertion of CKIORTN causes the quad-word of data that has been read from main memory 40 to be transferred from IO read memory data registers 190 and 192 (FIG. 6D) and latched into a 128-bit register (quad-word) in the MDUs 38a and 38b (registers 194, 196 of FIG. 6D). The IOR0 flag is then deasserted (set to a one) and a second IOMREQ is generated, this time for the previously incremented content of IO ADDR REG1 86. When the IO read completes IOR1 is set to one, and a signal (STARTBIC) is issued to the BIC 30 (FIG. 2D) to begin the transfer of data read from main memory 40 to the bus 32. The MAU 36 remains in this state for as long as the BIC 30 is issuing IO read addresses and transferring data to the bus 32.

While in this state the MAU 36 performs the following operations:

(a) CKIORTN is asserted whenever the IOAMTCH signal 96a indicates that an IO address being received does not equal the IO address stored in the IO PREV ADDR REG 88, thereby staging a quad-word of data to be output from the MDUs 38a and 38b;

(b) both CKIO0 and CKIO1 are asserted whenever the IOAMTCH signal 96a indicates that an IO address being received does not equal the IO address stored in the IO PREV ADDR REG 88, thereby loading the quad-word aligned read address into IO ADDR REG0 84 and the incremented quad-word aligned read address into IO ADDR REG 186, while also reloading the IO PREV ADDR REG 88; and (c) an IO memory request (IOMREQ) is generated whenever CKIO0 and CKIO1 are generated, thereby prefetching into registers 190 and 192 of the MDU 38 the next quad-word of data that is pointed at by the just-updated content of IO ADDR REG1 86.

As was noted above, each generated IO memory request, except the first request generated, uses the incremented address stored in IO ADDR REG1 86. As a result, and in that IO read requests typically read a block of data from contiguous memory locations, the MAU 36 operates to prefetch a next quad-word aligned block of 16 data bytes into the MDUs 38a and 38b whenever the BIC 30 provides an IO address that does not match the IO address stored in the IO PREV ADDR REG 88.

Figure 6A:
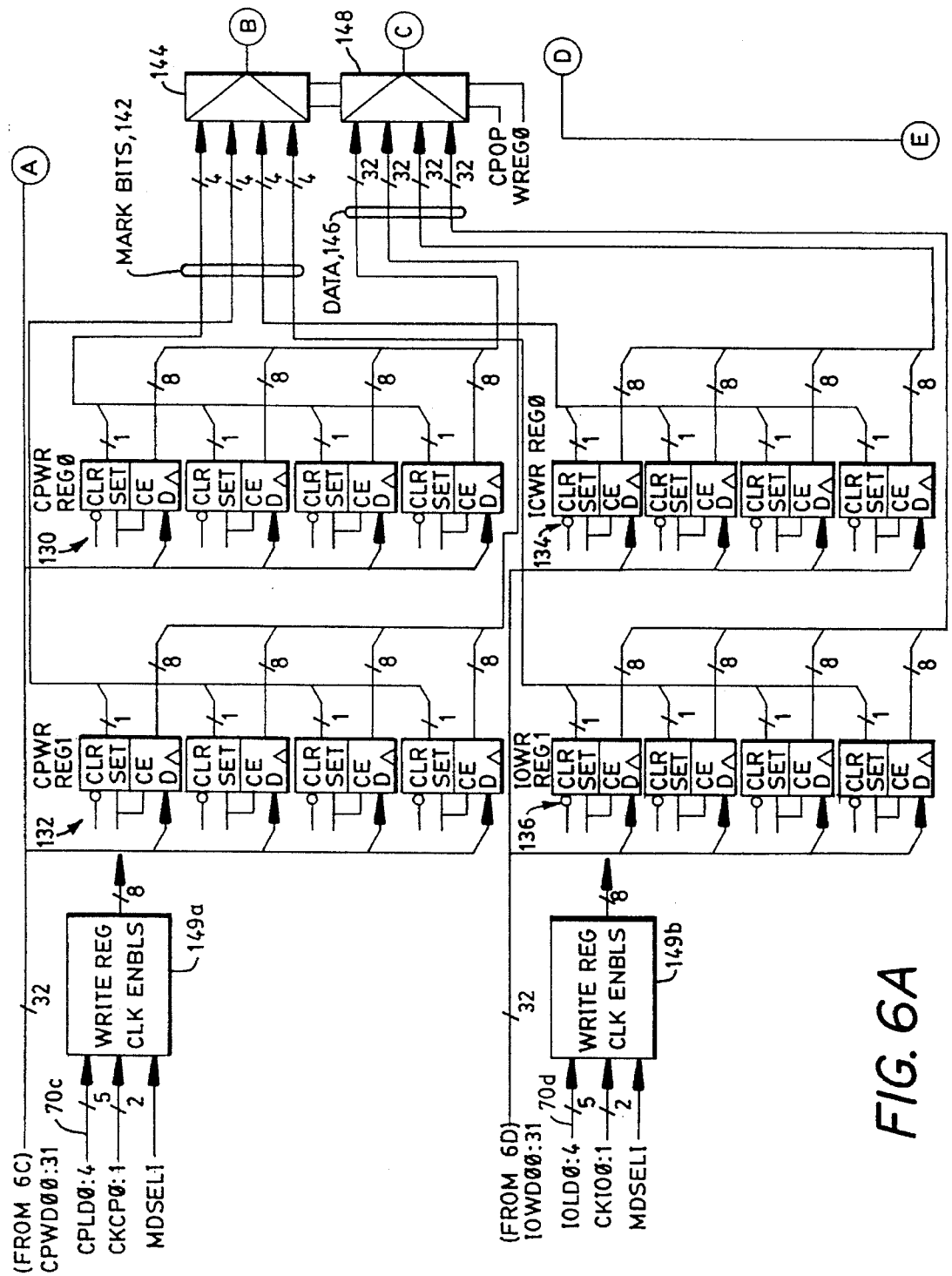
FIGS. 6A–6D are each a portion of a block diagram of a Memory Data Unit (MDU) that is a component of the block diagram of FIGS. 2A–2D, two of which are specifically illustrated in FIG. 2C, the MDU being another circuit block that is included within the single integrated circuit of this invention.
Figure 6B:
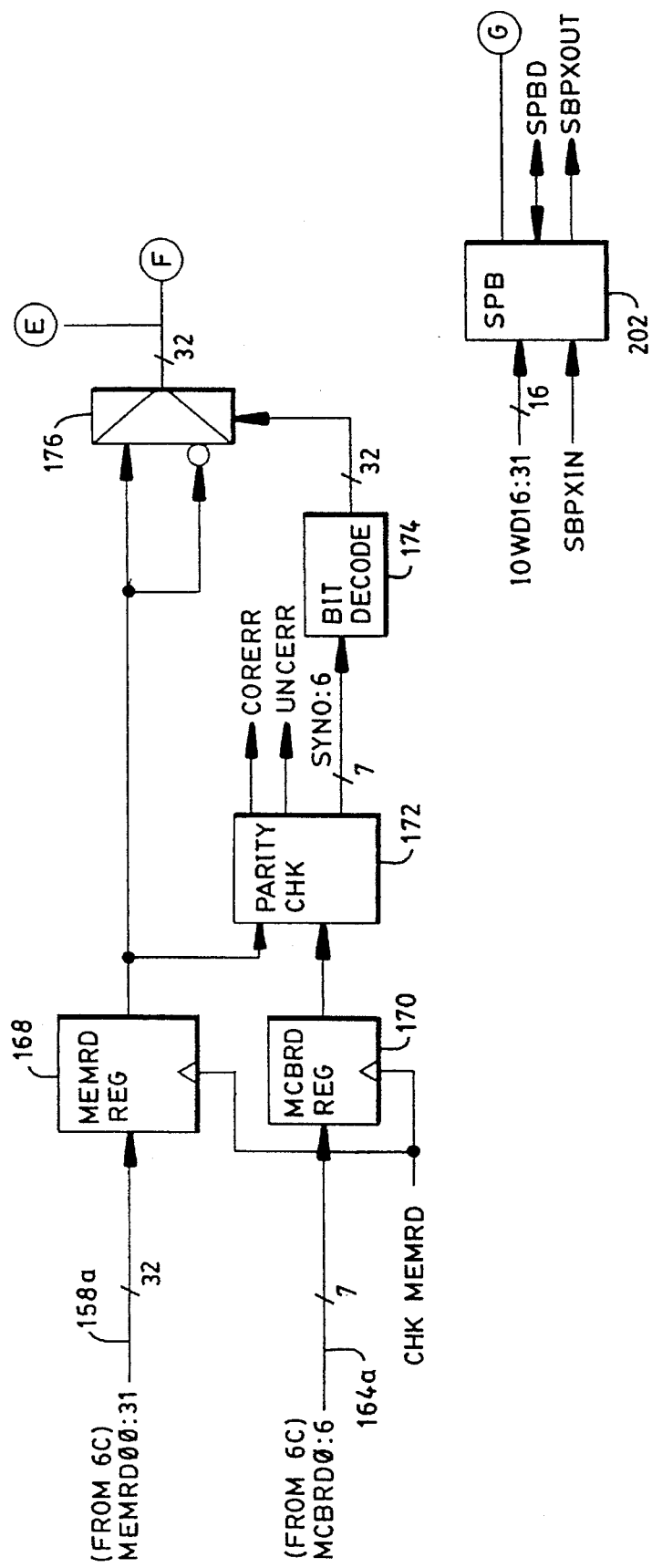
Figure 6C:
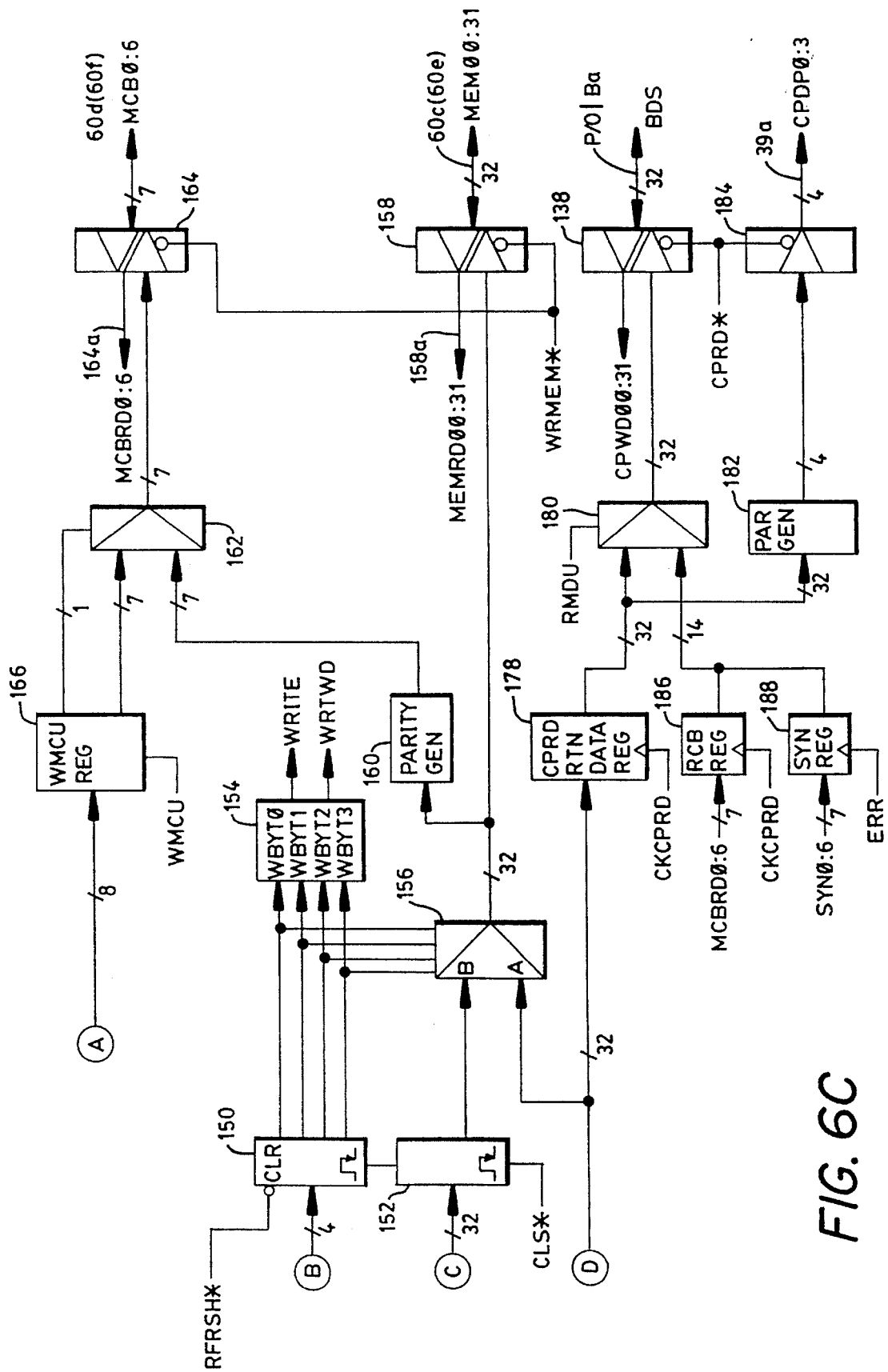
Figure 6D:
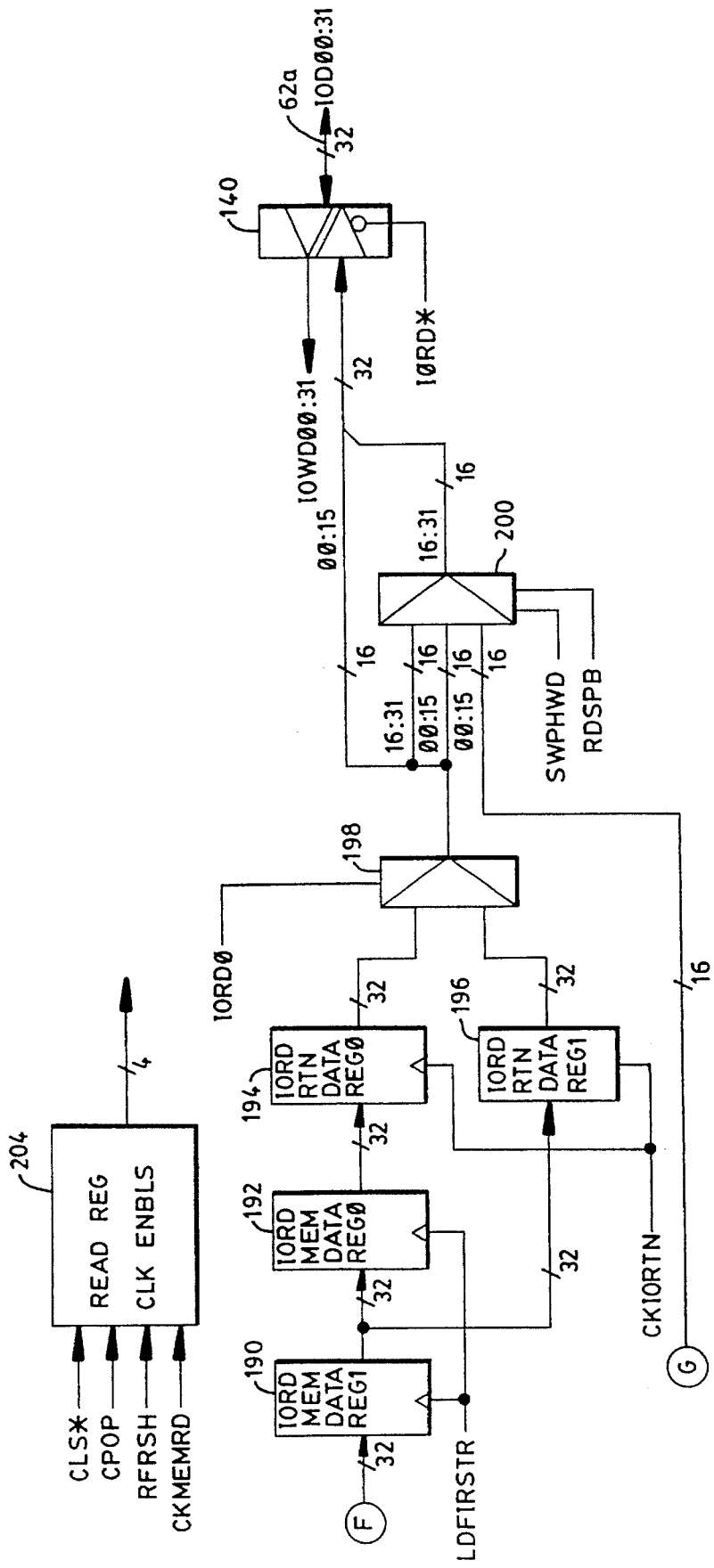

For example, the BIC 30 may be reading and transferring bytes, half-words, or words of data from the main memory 40 to an IO device coupled to the bus 32. As such, the BIC 30 may issue up to 16 read requests (assuming byte-wide transfers) for a given quad-word, before issuing a read request that causes the IOAMTCH signal 96a to go false. For each of these read requests, in that the IOAMTCH signal 96a remains true, the requested data is provided from the IO read return data registers 194 and 196 (FIG. 6D) of the MDUs 38, while a previously prefetched quad-word is already stored within IO read memory data registers 190 and 192 (FIG. 6D). When the IOAMTCH signal goes false, indicating that the BIC 30 is requesting a read from a next quad-word, the contents of the IO read memory data registers 190 and 192 within the MDUs 38 are transferred to the IO read return data registers 194 and 196, by the assertion of CKIORTN in State 110, and the BIC read request is then fulfilled. At the same time an IO memory request (IOMREQ) is issued, using the incremented quad-word aligned address in IO ADDR REG1 86, to pre-fetch a next quad-word into the IO read memory data registers 190 and 192 of the MDUs 38. As a result of this operation, the IO read data buffer circuitry stays one quad-word ahead of a current IO read operation being controlled by the BIC 30, and the number of main memory accesses is reduced.

For IO write operations the multiplexel 92 and adder 94 are not used. Instead, the circuitry operates in a similar fashion to the CP circuitry (registers 74, 76, 78 and comparator 80) as described previously.

In response to an IO write operation the IO write address is latched into IO ADDR REG0 84 (CKIO0) and the BIG 30 is started. In that IORD is not asserted, the multiplexer 92 does not operate to quad-word align the write address. As a result the address stored in IO ADDR REG0 84 and also in the IO PREV ADDR REG 88 is not quad-word aligned, but instead represents a double word (LSB bits 29, 30 and 31 are not registered). For every subsequent IO write that is within the same double word (IOAMTCH true), the IO ADDR REG0 84 is clocked, as is the IO PREV ADDR REG 88. This results in the IO write data being accumulated within the MDUs 38a and 38b, as specified by the five IOLD bits that are generated by the CP/IO write register control block 70 for each IO write operation.

On the occurence of IOAMTCH going false, indicating that the BIC 30 has incremented the IO write address beyond the double word address stored in the IO PREV ADDR REG 88, CKIO1 is generated to latch the current IO write address (as does the IO PREV ADDR REG 88), and a memory request is issued (IOMEMRQ) to write the accumulated data from the MDUs 38 into main memory 40. For every subsequent IO write that is within the same double word (IOAMTCH true), IO ADDR REG1 86 is clocked, as is the IO PREV ADDR REG 88. This again results in the IO write data being accumulated within the MDUs 38a and 38b. On the occurence of IOAMTCH going false, indicating that the BIC 30 has incremented the IO write address beyond the double word address stored in the IO PREV ADDR REG 88, CKIO0 is generated to latch the current IO write address into IO ADDR REG0 84 (and also into the IO PREV ADDR REG 88), and a memory request is issued (IOMEMRQ).

The MAU 36 alternates between the use of IO ADDR REG0 and IO ADDR REG 1 until the STARTBIC signal goes false, indicating an end of the IO write sequence.

The specifics of the MDU 38 operations in accumulating write data, before the data is actually written to main memory 40, are described below.

In summary, the IO Bus to Memory Interface includes the two 24-bit memory IO address registers 84 and 86, the 24-bit previous IO address register 88, the address comparator 96, two 64-bit memory write buffers with associated mark bit registers (located within the MDUs), and the memory read data FIFO (also located within the MDUs). The IO interface provides an efficient, high speed buffering mechanism that accommodates several types of IO DMA transfers with a small amount of control logic, while retaining a sufficient amount of residual memory bandwidth for CP 12 and refresh accesses. The IO interface operates in one of two modes, IO write transfers to main memory 40 and IO read transfers from main memory 40. During IO to memory transfers each IO write causes the IO PREV ADDR REG 88 and one of the memory address registers (84 or 86) to be loaded with the memory write address, along with appropriate data and modified flag(s) being loaded within the MDUs 38a and 38b. Subsequent writes load the same registers if the comparator 96 indicates an address match. If no match is indicated, a memory request is generated and the other register are used. Read operations are performed by first loading the MDU read data registers with 256-bits of read data from memory locations specified by the quad-word aligned address in IO ADDR REG0 84, followed by the incremented quad-word aligned address in IO ADDR REG1 86. The transfer is then begun (STARTBIC) and all incoming IO read addresses are checked for a current quad-word compare. If an incoming IO read address is not equal to the content of the IO PREV ADDR REG 88, a memory read request is generated, and the MDU read data registers are advanced. A significant feature of this aspect of the invention is that no specific addresses are used, and a knowledge of a transfer width (byte, word, etc.) is not required to determine memory operation types. That is, so long as an incoming IO read address is within a quad-word of the quad-word aligned address stored in the IO PREV ADDR REG 88, the requested data is supplied to the IO sub-system for transfer to a requesting agent, such as a disk or communication port.

Having described the address processing for CP 12 and IO operations, the remainder of the MAU 36 will now be described. Adders used as comparators 98 and 100 operate in conjunction with a Decode Memory Configuration logic block 102, to detect the presence of an illegal CP-generated memory address (CPIMA) and an illegal IO-generated memory address (IOIMA), respectively. In the presently preferred embodiment of the invention the main memory 40 is implemented with Single In-line Memory (SIM) circuit packages which output 6-bits of status information on PDX0:5. The Decode Logic Block 102 is responsive to five bits of the PDX bus to output five bits, indicating a highest memory address, to the comparators 98 and 100, which also receive five MSBs of the CP address bus 34a and five MSBs of the IO address bus 36a, respectively. The presence of an illegal address condition is used to generate a program exception.

Refresh operations for the main memory 40 are accomplished with a Refresh Address Counter 104 which outputs a 24-bit refresh address and a Refresh Timer 106 which outputs a Refresh Request every 15.6 microseconds. A refresh grant signal (RFRSH) is applied as one selection input, in combination with signals CPOP and ADDR0, to an address multiplexer 108. The address multiplexer 108 selects an output address from one of five address sources: the Refresh Address Counter 104, the CP ADDR REG0 74, the CP ADDR REG1 76, the IO ADDR REG0 84, and the IO ADDR REG1 86. The selected memory address is latched in a Memory Address Latch 110, as is the RFRSH signal if present. Bits 05:08 of the latched address 110a are applied to a RAS/CAS Enable logic block 112, in conjunction with five SIM status bits and the latched RFRSH signal. Block 112 generates and outputs appropriate ones of four Enable RAS signals (ENARAS) and four Enable CAS signals (ENACAS). Bits 7:27 of the latched memory address 110a are applied to one input of an output memory address multiplexer 114. A second input (bit 28) of the output address multiplexer 114 is provided from an adder 116 which provides an incremented signal for any memory quad-word read (CP or IO). The output of the multiplexer 114 is the MA07:28 bus that is applied to the RAS/CAS multiplexer 46 of FIG. 2C. Bits 05:27, and the selectively incremented bit 28, of the latched memory address 110 are also applied as one input of an update multiplexer 118 which supplies the 24-bit update address bus (UPDT05:28) to the XMAR register 50 (FIG. 2A) and thus to the Tag Stores 56, 58 and, via multiplexer 20, to the address input of the CACHE 16. The second input of the update multiplexer 118 is provided, via External Memory Address Register (XMA REG) 120, from bits 05:28 of the IOADR bus 36a. Single input multiplexer 122 functions as a buffer for the update address. Bits 5:31 of the IOADR 36a are also applied to an adder 124 in combination with an output of a logic block 126. Logic block 126 is responsive to a 3-bit IO Command (IOCMD) 126a to generate a signal which is added to the IOADR bits 36a. If a carry occurs a Set Continuation Error (STCNU) signal is generated. The STCNU is used in a manner similar to the CPIMA and IOIMA signals, and generates an exception to the BIG 30. The exception in this case indicates that an illegal IO data transfer width has been requested.

Reference is now made to FIGS. 6A–6D for a description of the MDUs 38a and 38b. The MDUs 38a and 38b are substantially identical to one another in construction and operation and, as a result, the ensuing description will generally refer to both devices as the MDU 38.

Briefly, the MDU 38 provides a 64-bit data path for the CP 12 and two paralleled 32-bit data paths for the IO subsystem, with the 64-bit data CP 12 data path being evenly divided between the MDU 38a and the MDU 38b. The MDU 38 also provides, for each byte (8-bits) of the 64-bit and 32-bit data paths, storage for a Modified or Mark bit which, when set, indicates to the logic that the associated (modified or marked) byte is to be written to memory. Each data path (CP and IO) is double-buffered both for data and the associated Mark bits, with one buffer being associated with CP or IO ADDR REG0 of the MAU 36, while the other buffer is associated with CP or IO ADDR REG1 of the MAU 36. Logic is provided for selectively merging, into data read from main memory, those buffered bytes having a Mark bit that is asserted. The merging operation is accomplished as a read-modify-write (RMW) atomic memory operation. The MDUs 38a and 38b, in combination, also provide the quad-word FIFO (registers 190–196) that was referred to above in the description of the MAU 36 for IO read operations. Logic is provided for testing parity bits associated with data read from main memory 40, for correcting single bit errors, for providing indications of both correctable and uncorrectable errors, for setting error correction code (ECC) bits for data written into main memory, and for setting parity bits for data returned to the CACHE 16.

In greater detail, the MDU 38 includes, for the CP 12 data path, a first 32-bit input data register (CPWR REG0) 130 and a second 32-bit input data register (CPWR REG1) 132. For the IO data path, the MDU 38 includes a first 32-bit input data register (IOWR REG0) 134 and a second 32-bit input data register (IOWR REG1) 136. The 32-bit CP write data bus (CPWD) is sourced from one half of a transceiver 138 (FIG. 6C) that is coupled to 32-bits of the 64-bit BDSB 18a. The BDSB 18a is connected, as previously described, to the CACHE 16 and the CDU 18 in FIG. 2B. The 32-bit IO write data bus (IOWD) is sourced from one half of an IO transceiver 140 (FIG. 6D) that is coupled to the 32-bit IO Data Bus 62a. A total of 16 Mark bits that are output from the registers 130–136 form a Mark bus 142 that is applied to a 4-way multiplexer 144. A Mark bit is set automatically when a byte to be written to main memory 40 is sourced by the CP 12 or the IO into the associated 8-bit portion of the registers 130–136. A total of 128 data bits output from the registers 130–136 form a data bus 146 that is applied to a 4-way multiplexer 148. Logic block 149a is responsive to the CPLD0:4 70c bus that is output from the MAU 36, to two CP clock signals (CKCP), and to a Mode Select (MDSEL) input to generate eight clock enables for controlling the operation of the total of eight byte-wide (plus Mark bit) CP registers 130 and 132. In similar fashion, logic block 149b is responsive to the IOLD0:4 70d bus that is output from the MAU 36, to two IO clock signals (IOCP), and to the Mode Select input to generate eight clock enables for controlling the operation of the total of eight byte-wide (plus Mark bit) IO registers 134 and 136. The MDSEL input has a first logic state for the MDU 38a and a second logic state for the MDU 38b, and is a function of which position on the printed circuit board that the MDU device is installed within.

In general, the logic blocks 149a and 149b cooperate with the MAU 36 to selectively accumulate within the registers 130–136 the data from a plurality of CP or IO writes. So long as write addresses (CP or IO) are within a given double word the associated write data is accumulated in the registers 130, 132 (CP writes) or 134, 136 (IO writes). Only when a write address is outside of a given double word is the content of the registers 130, 132 or 134, 136 written out to main memory 40, using the address buffered in the MAU 36, and as specified by the state of the associated Mark bits.

Multiplexers 144 and 148 are controlled by two signals (CPOP and WREG0) which define whether a CP or an IO memory operation is in process, and whether the corresponding REG0 (130, 134) or REG1 (132, 136) is being used. The selected 4-bit output of the Mark multiplexer 144 is applied to a transparent latch 150, while the selected 32-bit output of the data multiplexer 148 is applied to a transparent latch 152. The latched Mark bits are input to a logic block 154 which decodes the bits to determine a type of main memory cycle to be performed (read, write, read/modify/write). The decoded indication is provided to the memory controller 31 in FIG. 2D.

The following two Tables show the significance of the Mark bits in generating the WRITE and WRTWD signals, and the interpretation by the memory controller 31 of the WRITE and WRTWD signals from the MDUs 38a and 38b. In the second table WRITE0 and WRITE1 refer to the WRITE signal generated by the MDU 38a and the MDU 38b, respectively. The same convention is employed for the WRTWD0 and WRTWD1 signals.

| MARK BITS | WRITE | WRTWD |
| --- | --- | --- |
| 0000 | 0 | 0 |
| 1111 | 1 | 1 |

-continued

| | any other | 1 | 0 | |
|---|---|---|---|---|
| WRITE0 | WRTWD0 | WRITE1 | WRTWD1 | MEM OPERATION |
| 0 | 0 | 0 | 0 | READ |
| 1 | 0 | X | X | RMW |
| X | X | 1 | 0 | RMW |
| 1 | 1 | 0 | 0 | WRITE |
| 0 | 0 | 1 | 1 | WRITE |
| 1 | 1 | 1 | 1 | WRITE |

For either case (WRITE or WRTWD) the latched Mark bits are also applied as control inputs to a Merge Multiplexer (MERGEMUX) 156 which functions to selectively replace one to three bytes, for a partial word write operation, of a word read from memory (input A) with a corresponding latched byte or bytes from the latch 152. For a word write operation a RMW memory operation is not required and, as a result, all four latched bytes are driven through the MERGEMUX 156, with the input A being a "don't care". The output of the MERGEMUX 156 is subsequently driven through one half of a transceiver 158 to the memory data bus 60c or 60e, depending on whether the MDU is installed as the MDU 38a or the MDU 38b, respectively. In parallel, a parity generator 160 generates 7-bits of parity information over the 32-bit word output by the MERGEMUX 156. The parity information is driven through a multiplexer 162 and one half of a transceiver 164 to the memory parity bus 60d or 60f, depending on whether the MDU is installed as the MDU 38a or the MDU 38b, respectively. The second input to the multiplexer 162 is provided from a register 166 which is used for diagnostic purposes, and which provides a capability to force the parity bits to any desired state.

Having described the output (write) data path to the main memory 40, a description is now made of the input (read) data path from the main memory 40. Transceivers 158 and 164 source an internal 32-bit Memory Read (MEMRD) bus 158a and a 7-bit parity (MCBRD) bus 164a, respectively, to a Memory Read Register (MEMRD REG) 168 and MCBRD REG 170, respectively. A Parity Checker 172 is connected to the output of the MCBRD REG 170 and to the output of the MEMRD REG 168 to provide signals that indicate an occurrence of a correctable error or an uncorrectable error in the data read from the main memory 40. The Parity Checker 172 also outputs seven syndrome bits to a bit decoder 174 having a 32-bit output that is applied as control signals to a correction multiplexer 176. Correction multiplexer 176 includes 32, two input multiplexers each of which receives one bit of the registered memory read bus and the inversion of that bit. Depending on the state of the associated bit from the bit decoder 174, the true or the inverse of each bit is selected, thereby providing a mechanism to selectively correct an erroneous bit error in the 32-bit data word read from the main memory 40. The output of the correction multiplexer 176 forms a corrected read data bus that is input to the above-described MERGEMUX 156 for CP 12 and IO write operations, and also to a CP Read Return Data Register 178 for coupling, during a CP Read (CPRD*) operation, to the CACHE 16 and CDU 18 via a multiplexer 180, the transceiver 138, and one half of the BDSB 18a. A parity generator 182 generates 4-bits of parity over the 32-bits of corrected read data, and provides the parity information to one half of the CP Data Parity (CPDP) bus 39a, via an output driver 184.

Registers 186 and 188, in cooperation with multiplexer 180, provide a capability for the 7-bit MCBRD bus 164a and the 7-bits of syndrome information, generated by Parity Checker 172, to be placed on the BDSB 18a. These circuits are used for diagnostic purposes.

The output of the correction multiplexer 176 that forms the corrected read data bus is also input to the first IO Read Memory Data Register (IO MEM DATA REG1) 190 and thence to the second IO Read Memory Data Register (IO MEM DATA REG0 ) 192. These two registers, in combination with the corresponding two registers in the second MDU, form a part of the above-described quad-word FIFO that is used during IO read operations. The 32-bit output of IO MEM DATA REG0 192 is input to the first IO Read Return Data Register (IORD RTN DATA REG0) 194, while the 32-bit output of IO MEM DATA REG1 190 is input to the second IO Read Return Data Register (IORD RTN DATA REG1) 196. Registers 194 and 196 are loaded by the assertion of the above-described CKIORTN signal. The registers 194 and 196, in combination with the corresponding two registers in the second MDU, form the above-mentioned quad-word IO data return register for use during IO read operations. A multiplexer 198 selectively outputs either the output of the IORD RTN DATA REG0 194, or the output of the IORD RTN DATA REG1 196, to the output half of the IO transceiver 140 and to a multiplexer 200. Multiplexer 200 is responsive to a Swap Half Word (SWPHWD) input signal to selectively re-order the two 16-bit half-words that are output from the multiplexer 198 before application to the output half of the IO transceiver 140. A further input to the multiplexer 200 is a 16-bit bus output by a Support Packet Bus (SPB) device 202. This 16-bit bus is used for diagnostic purposes, and is selected by a Read SPB (RDSPB) signal being true to the multiplexer 200. As with the other diagnostic functions and circuitry described previously, the operation of the SPB device 202 is not germane to an understanding of the circuit operation, and is not described further.

A logic block designated as Read Register Clock Enables 204 is responsive to a plurality of inputs for generating the required register clocking signals for the registers involved in providing read data to the CP 12, via CACHE 16 and CDU 18.

During memory refresh operations the parity checker 172 is used to check the parity of a word read out of main memory 40. If a single bit error is found, the error is corrected in the correction multiplexer 176, and the corrected word is written out to main memory 40. This operation is facilitated by forcing the output of the Mark bit latch 150 to zero with the RFRSH* signal that is applied to the clear input, thereby selecting the A input of the MERGE-MUX 156 for all four bytes of corrected read data. If an uncorrectable error is detected, the defective, uncorrectable word is not written back to the main memory 40. Using this technique, and assuming that the main memory 40 includes 128 Mbytes of storage and that a refresh cycle occurs approximately every 16 microseconds, the entire main memory 40 can be "scrubbed" in approximately 4.5 minutes.

In accordance with foregoing description it can be appreciated that the MDUs 38a and 38b provide a memory operation queue that is comprised of the 64-bit memory data registers 130–136, with their associated modified or Mark bits, and the 24-bit memory address registers (74, 76, 84, 86 of the MAU 36). These register sets, in conjunction with associated control logic, are used to queue and execute memory operations. A basic operation of the memory queue is to hold memory operations from the CP 12, the IO subsystem, and the Refresh Timer 106, and to execute these operations according to their relative levels of priority. When a memory request is received the arbitration circuit of the memory controller 31 determines which pending operation has the highest priority request, and the appropriate staging of the logic is performed. When available, the memory controller 31 opens then closes the current memory latch and initiates the memory operation by asserting the RAS signal. In parallel, the memory controller 31 interrogates the Mark bits, as reflected in the WRITE and WRTWS signals output from decoder 154, and determines the type of memory operation (RMW, READ, WRITE). As such, no dedicated memory commands are stored in the queue. Instead, all command information is determined from the Mark bits. That is, if no Mark bits are set, the memory operation is a read. If any, but not all Mark bits are set in either word (MDU 38a or MDU 38b), the memory operation is a RMW, with the bytes to be modified specified by the Mark bits that are set. If all Mark bits are set, in one or both words, the memory operation is a write operation (not a RMW). If a refresh operation is selected the Mark bits are forced to an un-marked condition, and the memory operation is selected to be a read with a conditional write-back for error scrubbing.

Having described in detail the functioning of the CDU 18, the MAU 36 and the MDUs 38a and 38b, a description is now made of a presently preferred embodiment of an integrated circuit device that includes these three sub-systems of the data processor 10.

FIG. 7 is a block diagram of a gate array integrated circuit 300 that contains three separate and discrete functional circuit blocks 300a, 300b and 300c. In a presently preferred embodiment of this invention the block 300a incorporates the circuitry of the CDU 18, block 300b incorporates the circuitry of the MAU 36, and block 300c incorporates the circuitry of the MDU 38. Circuit 300 includes a pin interface block 302 that contains bi-directional driver/receivers 302a, output drivers 302b, and input receivers 302c. Interposed between the circuit blocks 300a–300c and the pin interface block 302 is a gating block 304. The gating block 304 is responsive to mode select interface pins 306 for selectively coupling input and output signal lines of one of the circuit blocks 300a, 300b, or 300c to predetermined ones of the interface pins through the pin interface block 302. It is noted that the bi-directional interface pins are typically connected to a driver/receiver pair at the interface block 302a. The internal signals are distributed, as required, to the circuit blocks 300a, 300b, and 300c, via the gating block 304, as separate input and output signal lines.

For example, the gating block 304 may operate to place output signals of non-selected circuit blocks into a high impedance state, and to place input signals of non-selected circuit blocks into a known logic state. In a presently preferred embodiment of the invention, that employs CMOS technology, multiplexers are employed to select one of up to three signals orginating from the circuit blocks 300a–300c for connection to a common output interface pin. One such gating multiplexer 304a is illustrated in FIG. 7. The gating multiplexers are controlled either directly, or indirectly via decoding logic, by the signals appearing on the mode select (MS) interface pins. Input signals from the interface pins can be distributed, as required, to one or more of the circuit blocks.

The end result is that the circuit block that is specified by logic levels applied to the mode select interface pins 306 is operatively coupled to predetermined ones of the interface pins, while all other, non-selected, circuit blocks are effectively disabled. If desired, the gating block 304 can also apply a reset signal to the logic circuitry of the non-selected circuit blocks to ensure that they remain in a low power, quiescent state.

The mode select interface pins 306 can also be employed to place an activated one of the circuit blocks 300a, 300b, 300c into a desired state. For example, and as was described above, the MDUs 38a and 38b operate in a slightly different manner depending on whether they are coupled to the odd or the even memory array of the main memory 40. Therefore, and assuming that the mode select interface pins 36 have logic levels to select the MDU function of the circuit 300, a selection between the odd and even MDUs is also specified through the logic levels applied to the mode select interface pins.

The following Table presents but one suitable encoding scheme for the logic levels that are applied to the mode select interface pins 306, as a function of PC board position.

| MODE SELECT 0 | MODE SELECT 1 | STATE |
| --- | --- | --- |
| 0 | 0 | Select CDU 18 |
| 0 | 1 | Select MAU 36 |
| 1 | 0 | Select MDU 38 (even) |
| 1 | 1 | Select MDU 38 (odd) |

As can be appreciated, a common gate array device can be specified, fabricated, and stocked for use. Only when the gate array device is physically and electrically coupled to the printed circuit board, and subsequently energized, does it automatically configure itself into one of a plurality of predetermined circuit blocks and thereafter assume the functionality that is associated with the printed circuit board position where it is installed.

As employed herein, a gate array is considered to also encompass an array comprised of transistor cells and, in general, any array of relatively simple embodiments of logic functions, and assemblages of logic functions, that are capable of being interconnected with one another to implement a desired logic design, such as a selected partition of a data processing system.

Figure 8:
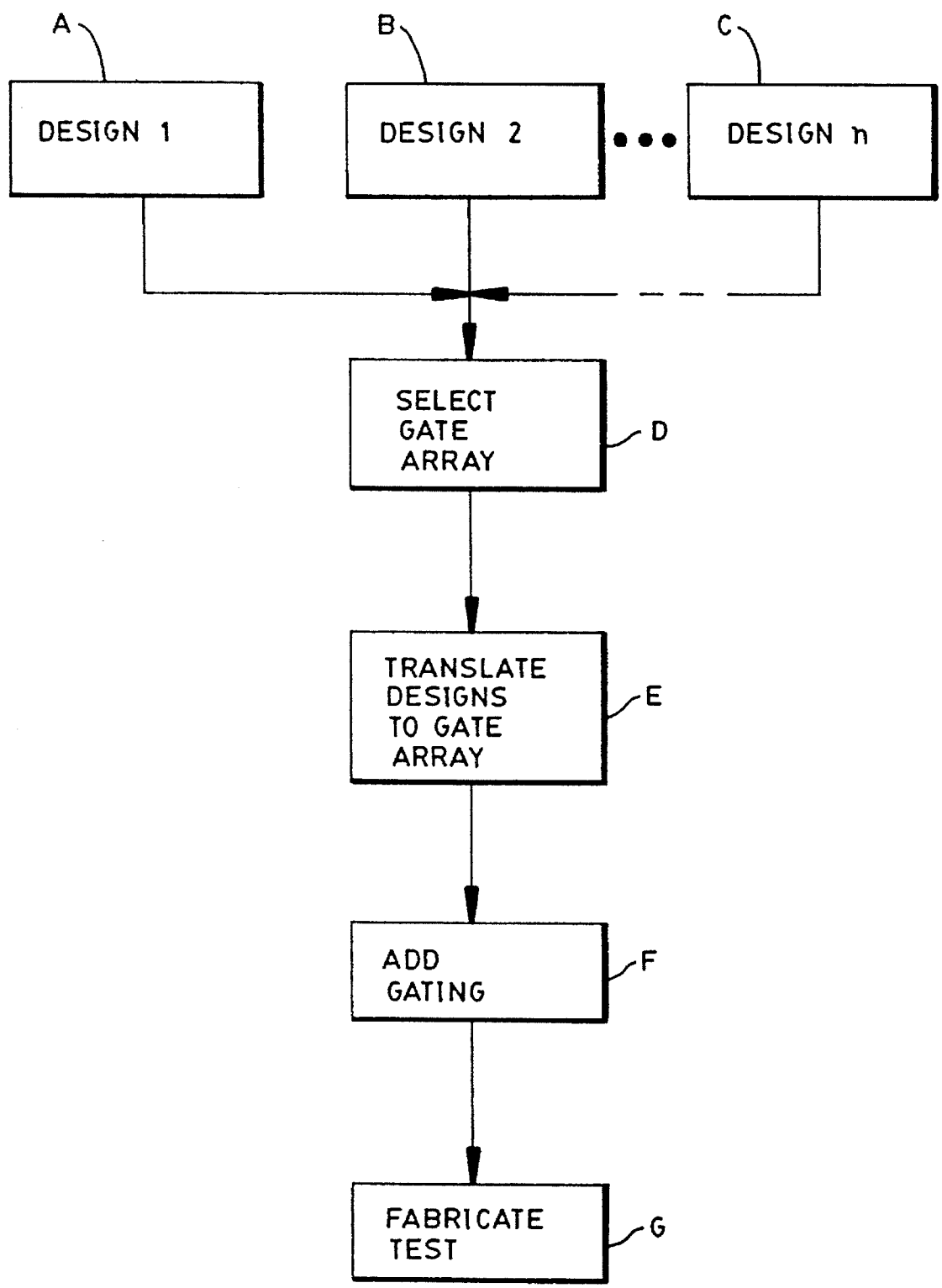
FIG. 8 is a flowchart that illustrates a method of this invention.

Reference is now made to the flowchart of FIG. 8. At Blocks A, B and C a plurality of circuit designs are provided. The circuit designs may be totally independent of one another, although two or more may receive a common signal or signals, such as clock frequency.

At Block D the plurality of designs are evaluated, using software tools provided by the gate array vendor, to determine (a) a total number of gates that will be required to implement each design, and (b) a total number of bi-directional, input, and output interface pins that will be required for each design. Based on these determinations, a gate array type is selected that has a total number of gates that exceeds the sum of the required gates for each design, and that also provides a sufficient number of interface pins to accommodate the circuit design having the largest required number of interface pins for a given class (bi-directional, input, output).

In this regard it is noted that, in the presently preferred embodiment of the invention, the numbers of bi-directional, input, and output pins are considered separately. However, it is also within the scope of the invention to assign all or most of the interface pins to be bi-directional. While this may simplify the assignment of interface pins between the various designs that are being accommodated, the use of a bi-directional pin will generally consume more power than the use of a pin defined solely as an input pin or as an output pin. Additional ground pins may also have to be provided as the number of bi-directional interface pins is increased.

At Block E each of the circuit designs is translated into a gate array equivalent, again using the appropriate software tools provided by the gate array vendor.

At Block F the gating block 304 is designed and translated into a gate array equivalent. This step assumes that a sufficient number of uncommitted gates are available after the execution of Block D.

At Block G the gate array design is fabricated and tested.

One suitable gate array that can be used in accordance with the teaching of this invention is known as an LCA10066 that is manufactured by the LSI Logic Corporation of Milipitas, Calif. This particular gate array is described in a publication entitled "1.0 Micron Array-Based Product", (September 1991), which is available from LSI Logic Corporation. Also by example, and for a cell-based array, the various software tools that are employed to evolve initial circuit designs into a completed array are described in several publications that are listed on pages iv and v of a publication entitled "Specific Guidelines for Designs Using LSI Logic's Cell-Based Technology", (February 1991), which is available from LSI Logic Corporation.

In the presently preferred embodiment of the invention a total of 168 interface pins are required. The interface pins are allocated as follows.

| clock input: | 1 (common to all circuit blocks) |
| --- | --- |
| inputs: | 51 |
| outputs: | 11 |
| bi-directional: | 105 |

The teaching of this invention takes advantage of the number of usable gates or cells within an array that has an adequate number of interface pins to accommodate a given design. The combination of a multiplicity of different circuit blocks into a single array is achieved by partitioning a system design into functional circuit blocks, and choosing a single package having a sufficient number of interface pins to accommodate a largest partition. The circuit blocks are all designed separately, then merged together, at the top level of the design hierarchy, with the decoding, multiplexing and interface pin configuring circuits that comprise the gating block 304.

There are a number of advantages that result from the use of the teaching of this invention. First, overall development and manufacturing costs are reduced. Second, the use of a single array in several locations for several different purposes results in one higher volume part rather than several lower volume parts, thus leveraging higher quantity discounts. In the presently preferred embodiment, the combined array design takes on one of three totally separate functions depending on where it is installed on the printed circuit board. The operation of the array is totally different for each mode, and may be represented on schematic drawings as several different arrays.

It should be realized that the foregoing description is not intended to limit the teaching of this invention. That is, a number of different types of circuit designs can be accommodated, other than the CDU 18, MAU 36, and MDU 38 designs that were described in detail above. Furthermore, the teaching of this invention can be used to combine from two to some arbitrarily large number of circuit designs within a given package, subject to constraints imposed by a total number of available gates and a total number of interface pins that can be dedicated as mode select pins.

Thus, while the invention has been particularly shown and described with respect to a preferred embodiment thereof, it will be understood by those skilled in the art that changes in form and details may be made therein without departing from the scope and spirit of the invention.

What is claimed is:

1. A method of fabricating an integrated circuit, comprising the steps of:

providing at least two circuit designs;

determining a total number of gates that are required to implement the at least two circuit designs within a gate array;

determining a maximum number of interface terminals that are sufficient to accommodate the interface terminal requirement of the circuit design that has a largest interface terminal requirement;

selecting a gate array type that has a number of gates that is greater than the determined number of gates and that has a number of interface terminals that is sufficient to accommodate the determined maximum number of interface terminals;

translating each of the designs into a gate array equivalent to provide a specification of a gate array circuit block for each of the designs;

defining at least one interface terminal to be a mode select input terminal; and determining a gate equivalent circuit of a gating logic block for selectively coupling only one of the circuit blocks to the interface terminals of the gate array in accordance with a logic state of an input signal to be applied to the at least one mode select terminal.

2. An integrated circuit having a plurality of interface terminals, said integrated circuit being used in the construction of a data processing system that includes at least two partitions, each of said at least two partitions being comprised of circuitry that is necessary to implement at least one circuit block of the data processing system, said integrated circuit comprising:

a first circuit block comprised of a plurality of gate-equivalent circuits, said first circuit block comprising said first partition of the data processing system;

at least one other circuit block comprised of a plurality of gate-equivalent circuits, said at least one other circuit block comprising said second partition of the data processing system;

at least one control interface terminal; and gating means interposed between said first and second circuit blocks and said interface terminals for selectively coupling, in accordance with a logic level applied to said at least one control interface terminal, only one of said circuit blocks to said interface terminals, whereby a first one of the integrated circuits is used at one location on a circuit board substrate for implementing the circuitry of the first partition and a second one of the integrated circuits is used at another location on the circuit board substrate for implementing the circuitry of the second partition, in accordance with the logic level applied to said at least one control interface terminal at said first and second locations.

3. An integrated circuit as set forth in claim 2, wherein there are at least two control interface terminals, wherein a logic level of a first one of said control interface terminals specifies a circuit block for coupling to said interface terminals, and wherein a logic level of a second one of said control interface terminals specifies, for at least one of the circuit blocks, one of at least two modes of operation when the at least one circuit block is specified by the first one of the control interface terminals.

4. An integrated circuit having a plurality of interface terminals, said integrated circuit being used in the construction of a data processing system that includes at least two partitions, each of said at least two partitions being comprised of circuitry that is necessary to implement at least one circuit block of the data processing system, said data processing system further comprising a central processor (CP), and IO controller (IOC), and a main memory, said integrated circuit comprising:

a first circuit block comprised of a plurality of gate-equivalent circuits, said first circuit block comprising said first partition of the data processing system, said first partition comprising means for buffering addresses received from the central processor (CP) and addresses received from the IO controller (IOC) before application of the addresses to the main memory;

a second circuit block comprised of a plurality of gate-equivalent circuits, said second circuit block comprising said second partition of the data processing system and including means for buffering data received from the central processor (CP) and data received from the IO controller (IOC) before application of the data to the main memory;

at least two control interface terminals; and gating means interposed between said first and second circuit blocks and said interface terminals for selectively coupling in accordance with logic levels applied to at least one of said at least two control interface terminals, when installed upon a printed circuit board, only one of said circuit blocks to said interface terminals for connecting the selected circuit block to the CP, to the IOC, and to the main memory, whereby a first one of the integrated circuits is used at a first location on the printed circuit board for implementing the circuitry of the first partition and a second one of the integrated circuits is used at a second location for implementing the circuitry of the second partition, in accordance with the logic level applied to said at least one of said at least two control interface terminals.

5. An integrated circuit as set forth in claim 4 wherein the main memory includes an even word memory array and an odd word memory array, and wherein a logic level of one of said control interface terminals also specifies, to the second circuit block when the second circuit block is selected by a logic level applied to said at least one of said at least two control interface terminals, whether the second circuit block is coupled to the even word memory array or to the odd word memory array.

6. An integrated circuit as set forth in claim 4 wherein the data processing system further includes a cache memory, and wherein said integrated circuit is further comprised of a third circuit block comprised of a plurality of gate-equivalent circuits, said third circuit block comprising a third partition of the data processing system, said third partition comprising means for controllably routing data between the CP and the cache memory; and wherein said gating means is also interposed between said third circuit block and said interface terminals and is responsive to predetermined logic levels applied to said control interface terminals for selectively coupling said third circuit block to said interface terminals, whereby a third one of the integrated circuits is used at a third location for implementing the circuitry of the third partition, in accordance with the predetermined logic levels applied to said control interface terminals.

7. An integrated circuit as set forth in claim 4 wherein predetermined ones of said interface terminals are coupled, in a first mode of operation, to a first address bus having signal lines for conveying memory addresses from said CP, and to a second address bus having signal lines for conveying memory addresses from said IOC, and wherein predetermined ones of said interface terminals are coupled, in a second mode of operation, to a first data bus for transferring data to and from said CP, and to a second data bus for transferring data to and from said IOC.

8. An integrated circuit having a plurality of interface terminals, said integrated circuit comprising:

a first circuit block comprised of a plurality of circuits, said first circuit block comprising a first partition of a data processing system;

at least one other circuit block comprised of a plurality of circuits, said at least one other circuit block comprising a second partition of the data processing system;

wherein said first circuit block and said at least one other circuit block perform different logical functions of the data processing system;

at least one control interface terminal; and gating means interposed between said first and second circuit blocks and said plurality of interface terminals for selectively coupling, in accordance with a logic level applied to said at least one control interface terminal, only one of said circuit blocks to said plurality of interface terminals.

9. An integrated circuit as set forth in claim 8, wherein there are a plurality of control interface terminals, wherein a logic level of a first one of said plurality of control interface terminals specifies only one of said circuit blocks for coupling to said plurality of interface terminals, and wherein a logic level of a second one of said plurality of control interface terminals specifies a mode of operation of a specified one of said circuit blocks.

10. A data processing system comprised of a central processing unit, a memory for storing data, and a bus for coupling said central processing unit to said memory, the bus including a plurality of signal lines for conveying at least memory addresses from said central processing unit to said memory and for conveying data bidirectionally between said central processing unit and said memory, said data processing system further comprising bus interface circuitry that is interposed within said bus between said central processing unit and said memory, said bus interface circuitry comprising address interface circuitry and data interface circuitry, wherein said address interface circuitry and said data interface circuitry are disposed within a single integrated circuit package having a plurality of interface terminals and at least one control input terminal, wherein said plurality of interface terminals and said at least one control terminal of each of a plurality of said integrated circuit packages are electrically coupled to circuit wiring of at least one printed circuit board, wherein said at least one control terminal of a first one of said plurality of integrated circuit packages is electrically coupled to a first logic potential for selecting only said address interface circuitry to be coupled to said plurality of interface terminals and, through said plurality of interface terminals, to circuit wiring that is electrically coupled to said address signal lines; and wherein said at least one control terminal of a second one of said plurality of integrated circuit packages is electrically coupled to a second logic potential for selecting only said data interface circuitry to be coupled to said plurality of interface terminals and, through said plurality of interface terminals, to circuit wiring that is electrically coupled to said data signal lines.

11. A data processing system as set forth in claim 10 wherein said memory includes an even word memory array and an odd word memory array, wherein said data signal lines are comprised of a first group of data signal lines that are coupled to said even word array and a second group of data signal lines that are coupled to said odd word array, wherein said integrated circuit package includes a first and a second control terminal, wherein said first control terminal is used to select one of said address interface circuitry and said data interface circuitry for coupling to said plurality of interface terminals, wherein a first predetermined logic potential that is applied to said second control terminal is used, when said data interface circuitry is selected, to configure said data interface circuitry for being coupled through said plurality of interface terminals to circuit wiring that is electrically coupled to said first group of data signal lines, and wherein a second predetermined logic potential that is applied to said second control terminal is used, when said data interface circuitry is selected, to configure said data interface circuitry for being coupled through said plurality of interface terminals to circuit wiring that is electrically coupled to said second group of data signal lines.

* * * * *